United States Patent
Zeng et al.

(10) Patent No.: US 8,680,837 B2
(45) Date of Patent: Mar. 25, 2014

(54) DRIVER FOR DRIVING POWER SWITCH ELEMENT

(75) Inventors: Jian-Hong Zeng, Shanghai (CN); Jian Jiang, Shanghai (CN); Qifeng Ye, Shanghai (CN); Jian-Ping Ying, Shanghai (CN)

(73) Assignee: Delta Electronics, Inc., Taoyuan Hsien (TW)

( * ) Notice: Subject to any disclaimer, the term of this patent is extended or adjusted under 35 U.S.C. 154(b) by 380 days.

(21) Appl. No.: 13/048,534

(22) Filed: Mar. 15, 2011

(65) Prior Publication Data
US 2012/0008344 A1    Jan. 12, 2012

(30) Foreign Application Priority Data

Jul. 7, 2010   (CN) .......................... 2010 1 0219644

(51) Int. Cl.
*H03K 17/687*    (2006.01)
*G05F 1/46*    (2006.01)

(52) U.S. Cl.
USPC .......................................... 323/289; 327/109

(58) Field of Classification Search
USPC ................... 327/108, 109, 427, 434; 323/289
See application file for complete search history.

(56) References Cited

U.S. PATENT DOCUMENTS

| | | | | |
|---|---|---|---|---|
| 4,423,341 A | * | 12/1983 | Shelly | 327/112 |
| 4,656,414 A | * | 4/1987 | Morud | 323/289 |
| 4,728,817 A | * | 3/1988 | Jessee et al. | 327/109 |
| 4,970,620 A | * | 11/1990 | Lehnhoff et al. | 361/18 |
| 5,786,687 A | * | 7/1998 | Faulk | 323/289 |

* cited by examiner

*Primary Examiner* — Gary L Laxton
(74) *Attorney, Agent, or Firm* — Muncy, Geissler, Olds & Lowe, P.C.

(57) ABSTRACT

A driver for driving a driving element includes: a signal source, for providing a square signal; a first modulation circuit, for providing on-pulses and off-pulses according to edges of the square signal; a transformer for coupling output signals of the first modulation circuit to a secondary winding of the transformer to form coupled signals; a second modulation circuit for providing first operating pulses according to coupled on-pulses of the coupled signals, and providing second operating pulses according to coupled off-pulses of the coupled signals; a switch device for turning off the switch device according to the first operating pulses and turning on the switch device according to the second operating pulses, and when the switch device is turned off, coupled on-pulses charge an equivalent capacitor of the driving element to a first driving potential to turn on the driving element, and when the switch device is turned off, the equivalent capacitor discharges to a second driving potential to turn off the driving element, and the width of the on-pulses is less than 1000 ns.

35 Claims, 34 Drawing Sheets

DRIVER FOR DRIVING POWER SWITCH ELEMENT

CROSS REFERENCE TO RELATED APPLICATION

This Application claims priority of China Patent Application No. 201010219644.1, filed on Jul. 7, 2010, the entirety of which is incorporated by reference herein.

BACKGROUND OF THE INVENTION

1. Field of the Invention

The present invention relates to a driver and in particular relates to a driver for driving a power switch element.

2. Description of the Related Art

Drivers are necessary for controlling when to turn-off and turn-on power switch elements. For isolation purposes, transformers are used to deliver driving signals to power switch elements such as MOSFET, IGBT etc., as FIG. 1 shows. Transformers only deliver driving energy. Thus, when compared to the size of main circuits, the size of the transformers is relatively smaller. However, as power density and power efficiency requirements increasingly heighten, especially for low frequencies such frequencies lower than 10 kHz, the size and the power consumption of transformers become more of an issue.

The circuit 200 in the FIG. 2 is a conventional driver. The two sides of the transformer T may generate positive pulses and negative pulses according to the rising edges and falling edges of the driving signal 210 by design of the capacitance of the capacitor $C_Y$. The positive pulses pass through the diodes D1 and D2 to charge the gate capacitor $C_{iss}$ of the power switch element Q3 at a high potential. Because the transistor Q4 is closed at this moment, the gate of the power switch element Q3 has no loop to discharge such that a high potential is sustained. The negative pulses pass through the diodes D3 and D4 to turn on the transistor Q4 so that the voltage at the gate of the power switch element Q3 discharge to a low potential through the transistor Q4.

FIG. 3 is a waveform of the circuit shown in FIG. 2. PWMout is the driving signal 210, $V_{CY}$ is a waveform at the capacitor $C_Y$ in series with the primary winding of the transformer T, Ip is a current waveform of the primary winding of the transformer T, $V_{1/2}$ and $V_{3/4}$ are respectively voltage waveforms of the primary winding 270 and second winding 280 of the transformer T, and $V_{G/S}$ is a waveforms at the gate of the power switch element Q3. When the turn ratio of the primary winding and the second winding is 1:1, $V_{1/2}$ and $V_{3/4}$ have the same waveforms. The circuit can modulate the driving signal 210 to a signal with a smaller pulse width such as waveforms $V_{1/2}$ and $V_{3/4}$. With more narrow pulse signals, the products of the voltages and time of the pulses (i.e. products of the amplitude and width of the pulses) which the transformer T has to process may be smaller. Hence, the size of the transformer T may be reduced in accordance with circuit design.

However, there are a lot of drawbacks in the above mentioned prior art. For example, driving consumption is large. It can be understood that although pulses are delivered by the transformer T at the rising edges and falling edges of the driving signal 210, the primary winding 270 of the transformer T has to keep an average current at almost zero because of the capacitor $C_Y$. At the rising edge, the energy stored in the capacitor $C_Y$ has to be released before a next rising edge in order to sustain operation, which increases power consumption.

For example, the driving signal at the gate of the power switch element Q3 is pulled up slowly. The required waveform at the transformer T is performed through the capacitor $C_Y$. Accordingly, the capacitance of the capacitor $C_Y$ has to match the capacitance of the capacitor $C_{iss}$ at the gate of the power switch element Q3. A large capacitor $C_Y$ may not generate pulse signals with a relatively narrow width. Also, a matching capacitor $C_Y$ may have influential impedance, which blocks energy delivery and reduces rising speed of driving signals. Thus, turn-on power consumption of the power switch element Q3 is increased.

For another drawback, the circuit in the prior art is unreliable. When negative pulses disappear, the gate of the transistor Q4 is at a high-impendence status such that the gate of the power switch element Q3 is at a floating status, wherein an initial status is a low potential rather than an expected low impendence turn-on status. If the power switch element Q3 is charged because of other factor such as the Miller effect etc., the gate of the power switch element Q3 may not sustain a low potential so as to cause malfunction. Although the width of negative pulses may be increased to prolong a low impendence status, a wider pulse width means that the consumption of the transformer must be increased.

Thus, a driver with a small size, high reliability, fast rising speed of driving signals and low driving consumption is called for.

BRIEF SUMMARY OF INVENTION

A detailed description is given in the following embodiments with reference to the accompanying drawings.

One embodiment of the invention provides a driver for driving a driving element, comprising: a signal source, for providing a square signal; a first modulation circuit, for providing on-pulses and off-pulses according to edges of the square signal; a transformer, coupled to the first modulation circuit for coupling output signals of the first modulation circuit to a secondary winding of the transformer to form coupled signals; a second modulation circuit, coupled to the second winding of the transformer for providing first operating pulses according to coupled on-pulses of the coupled signals, and providing second operating pulses according to coupled off-pulses of the coupled signals; a unidirectional on device, coupled between a first node of the secondary winding of the transformer and a control node of the driving element; and a switch device, having a control node coupled to the second modulation circuit, a first node coupled to the control node of the driving element and a second node coupled to a second node of the secondary winding of the transformer, wherein the switch device is turned off according to the first operating pulses and is turned on according to the second operating pulses, and when the switch device is turned off, coupled on-pulses charge an equivalent capacitor of the driving element to a first driving potential to turn on the driving element, and when the switch device is turned off, the equivalent capacitor discharges to a second driving potential to turn off the driving element, and the width of the on-pulses is less than 1000 ns.

One embodiment of the invention provides a driving circuit for driving a driving element, comprising: a signal source, for providing a square signal; a first modulation circuit, for providing on-pulses and off-pulses according to edges of the square signal; a transformer, coupling to the first modulation circuit for coupling output signals of the first modulation circuit to a secondary winding of the transformer to form coupled signals; a second modulation circuit, coupled to the second winding of the transformer for providing first operating pulses according to coupled on-pulses of the coupled signals, and providing second operating pulses according to coupled off-pulses of the coupled signals; a unidirectional on device, coupled between a first node of the secondary winding of the transformer and a control node of the driving element; a unidirectional switch device, having a first node coupled to the control node of the driving element and a second node coupled to a second node of the secondary winding of the transformer, for turning off the unidirectional switch device according to the first operating pulses, and turning off the unidirectional switch device according to the second operating pulses, and when the unidirectional switch device is turned off, coupled on-pulses charge an equivalent capacitor of the driving element to a first driving potential to turn on the driving element, and when the switch device is turned off, the equivalent capacitor discharges to a second driving potential to turn off the driving element.

The driver and the driving circuit of the invention may balance excitation current so that power consumption resulting from capacitors charging and discharging may be prevented, driving efficiency may be increased and impedance for blocking energy delivery may be decreased. Therefore, rising and falling speed of signals are enhanced. Moreover, the driver and the driving circuit may shorten the width of on-pulses if rising speed of an equivalent gate capacitor is satisfied such that the time that pulses stay at the transformers is reduced. Note that it is advantageous to shorten the sizes of transformers in the driver or driving circuit. Also, the total impedance of an equivalent charge loop may be lessened because of a regulation circuit of the driver so that a quality factor Q of an equivalent resonance circuit may be magnified and driving power consumption may be minimized.

BRIEF DESCRIPTION OF DRAWINGS

The present invention can be more fully understood by reading the subsequent detailed description and examples with references made to the accompanying drawings, wherein:

FIG. 18b is an embodiment of a protection circuit in FIG. 18a;

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 4:
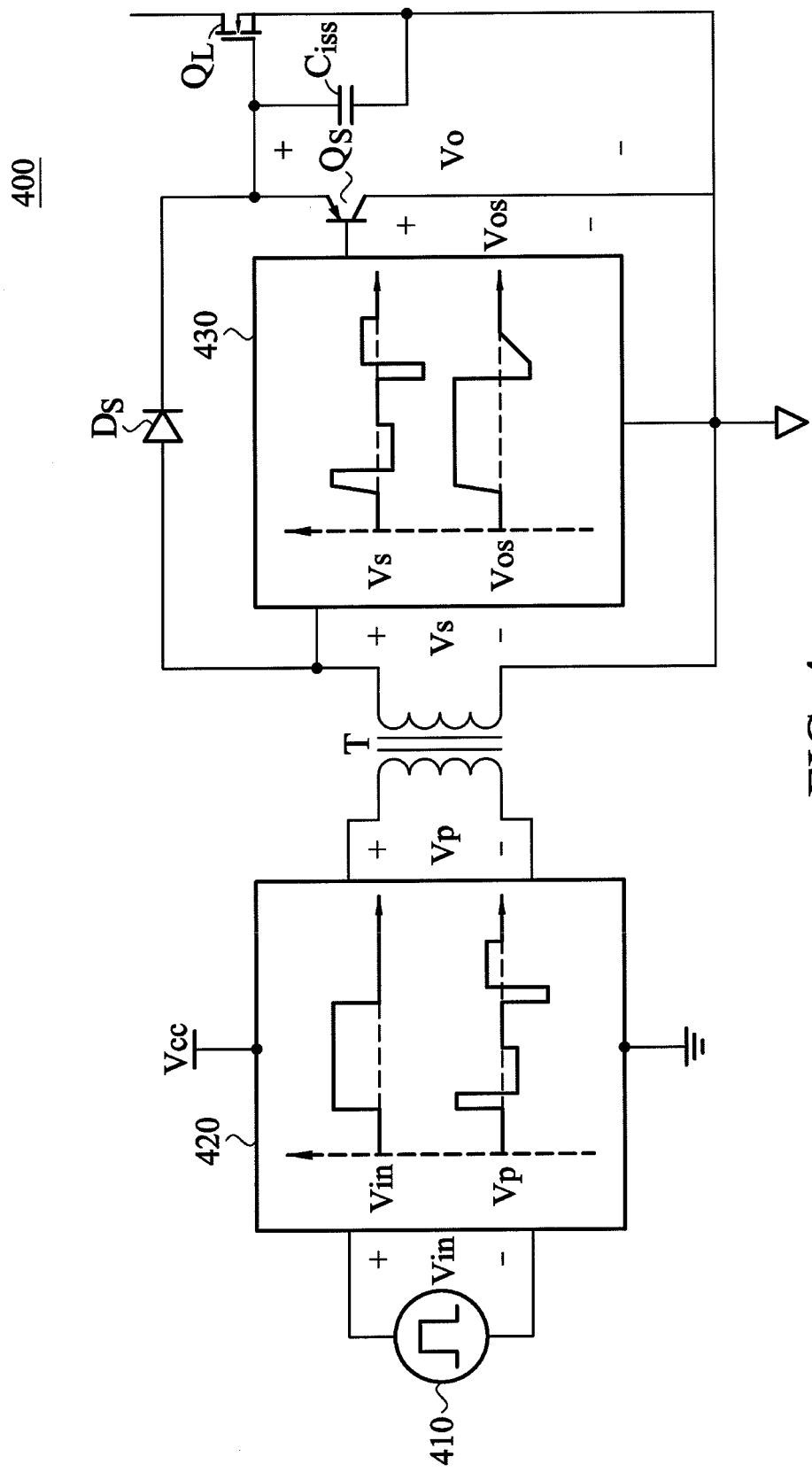
FIG. 4 is a diagram showing a driver of one embodiment of the invention.

FIG. 4 is a diagram showing a driver of the invention. The driver 400 includes a signal source 410, a first modulation 420, a transformer T, a second modulation circuit 430, a unidirectional on device Ds and a switch device Qs.

A signal source 410 provides a square signal, wherein a working frequency and duty cycle thereof may be changed dramatically. For example, the working frequency of the square signal may be a low frequency such as 10 k Hz or a high frequency such as more than 1 MHz, and the duty cycle of the square signal may be smaller than 2% or larger than 98%. The first modulation circuit 420 provides on-pulses according to edges such as rising edges of the square signal and the on-pulses are delivered to the control terminal, e.g. the gate of a driving element $Q_L$ such as the power switch element IGBT or MOS switch etc. through the transformer T and the unidirectional switch Ds. The on-pulses are used to turn on the driving element $Q_L$. Moreover, the first modulation circuit 420 also provides off-pulses according to edges of the square signal such as falling edges. The off-pulses are used to turn off the driving element $Q_L$. The first modulation circuit 420 may also provide off-pulses according to rising edges and provide on-pulses according to falling edges. The primary winding of the transformer T is coupled to the first modulation circuit 420. The Transformer T is used to receive signals from the first modulation circuit 420 and then delivers the received signals to a second winding of the transformer T to generate corresponding coupled pulses. For example, the primary winding of the transformer T receive on-pulses and then delivers the on-pulses to the secondary winding to generate corresponding coupled on-pulses. One side of the second modulation circuit 430 is coupled to the secondary winding of the transformer T, and the other side of the second modulation circuit 430 is coupled to the control terminal of a switch device Qs. The switch device Qs may be a MOS or BJT transistor or a combination of switch elements such as a BJT transistor and a diode in series etc. The modulation circuit 430 provides first operating pulses to turn off the switch device Qs according to the coupled on-pulses, and provides second operating pulses to turn on the switch device Qs according to the coupled off-pulses. When the switch device Qs is turned off, the coupled on-pulses charge the equivalent gate capacitor Ciss of the driving element $Q_L$ to a first driving potential to turn on the driving element $Q_L$, when the switch device Qs is turned on, the equivalent capacitor Ciss is discharged through the switch device Qs to a second driving potential to turn off the driving element $Q_L$, thereby controlling the power switch element.

Moreover, unidirectional on devices Ds, such as diodes, is coupled between the first terminal of the secondary winding of the transformer T and the control node of the driving element $Q_L$ and is used to protect the equivalent gate capacitor Ciss of the driving element $Q_L$ from discharging reversely. Furthermore, the on-pulses and the off-pulses generate excitation current at the primary winding of the transformer T. In order to protect the transformer T from saturation due to the excitation current, the first modulation circuit 420 generates one or more recovery pulses to balance the excitation current according to the on-pulses and off-pulses. In one embodiment, the first modulation circuit 420 respectively determines amplitudes and widths of corresponding one or more recovery pulses according to products (i.e. product of volt and time) of amplitudes and widths of the on-pulses. For example, an on-pulse with positive potential will follow a recovery pulse with a negative potential. The products of amplitudes and widths of the on-pulse are equal to products of amplitudes and widths of the recovery pulses (i.e. the same products of volt and time). In the same way, the off-pulses with negative potential also generate the recovery pulses with positive potential, thereby balancing excitation current on the transformer T.

Figure 5A:
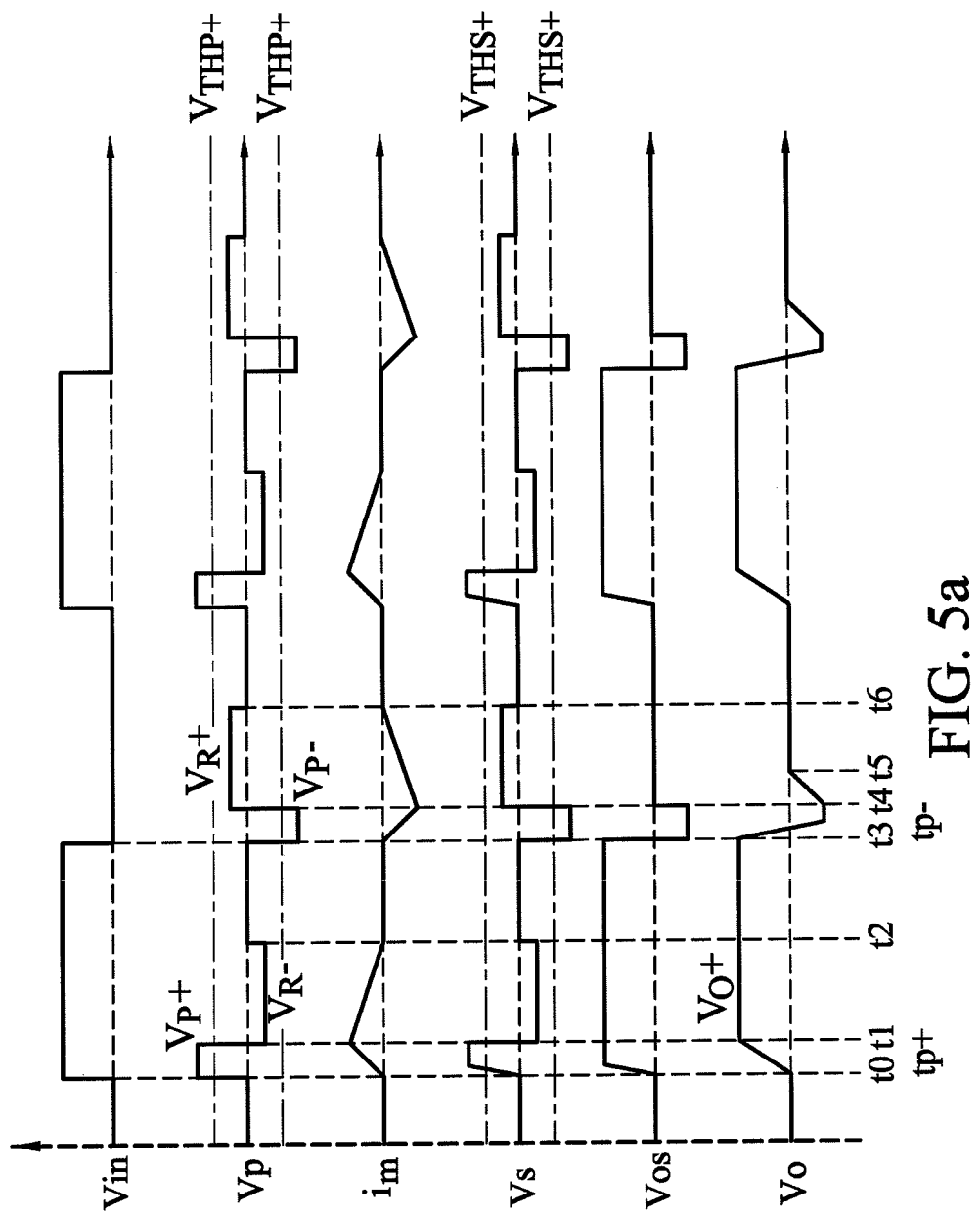
FIG. 5a is a waveform graph illustrating the driver of one embodiment of the invention when a signal source is a square wave with a low frequency and with a duty cycle of 50 percent.

FIG. 5a is a waveform graph illustrating the driver of one embodiment of the invention when a signal source is a square wave with a low frequency such as 10 k Hz~100 k Hz and duty cycle of 50 percent, i.e. a high potential pulse width is equal to low potential pulse width. At t0, the rising edge of the signal source 410 triggers the first modulation circuit 420 such that the voltage Vp at the output terminal of the first modulation circuit 420 is Vp+ and a duration time thereof is tp+, thereby forming the so called on-pulses. When the on-pulses are delivered to the secondary winding of the transformer T and then charge the equivalent gate capacitor Ciss of the driving element $Q_L$ through the unidirectional on device Ds, the control node of the driving element $Q_L$ is charged to a potential Vo+ at t1. The potential Vo+ can be maintained because the unidirectional on device Ds cannot be reversed after the voltage Vo of the control node of the driving element $Q_L$ is charged to potential Vo+. At this moment, the on-pulses are removed to make the on-pulses duration time tp+ as short as possible. Note that the switch device Qs has to be turned off. Therefore, the voltage Vos of the output terminal of the second modulation circuit 430 becomes a high potential according to the on-pulses such that the switch device Qs cannot be turned on (in the following embodiments, the switch device Qs is PNP BJT, and the driving element $Q_L$ is NMOS transistor, but are not limited thereto).

In one embodiment, there are thresholds $V_{THS+}$ and $V_{THS-}$ set for the second modulation circuit 430 being used to determine whether received pulses are on-pulses or off-pulses. That is, when positive input pulses exceed $V_{THS+}$, they are determined as the on-pulses, and when absolute values of negative input pulses exceed absolute value of $V_{THS-}$, they are determined as off-pulses. Note that the thresholds $V_{THS+}$ and $V_{THS-}$ set for the second modulation circuit 430 respectively correspond to the thresholds $V_{THP+}$ and $V_{THP-}$ set for the first modulation circuit 420. In one embodiment, the turn ratio of the primary winding and the secondary winding is 1:1, but is not limited thereto. Therefore, in this circumstance, thresholds $V_{THS+}$ and $V_{THS-}$ are respectively equal to thresholds $V_{THP+}$ and $V_{THP-}$. The transformer T is excited by the on-pulses to form an excitation current $i_m$. After the on-pulses are removed, the first modulation circuit 420 generates the recovery pulses with negative potential $V_R-$ which are maintained until the excitation is zero at t2. To prevent the second modulation circuit 430 from recognizing recovery pulses with positive potential as off-pulses such that the switch device Qs is erroneously turned on to discharge the gate capacitor Ciss, the absolute value of the potential VR− of the recovery pulses used for the first modulation circuit 420 are set to be less than the absolute value of the threshold $V_{TH+}$. Correspondingly, the absolute value of the potential of the recovery pulses in the signal Vs is also less than the absolute value of the threshold $V_{TH+}$. Hence the arrangement can make sure that the voltage Vos of the output terminal of the second modulation circuit 430 is maintained at a high level or high impedance such that the switch device Qs is kept turned off in favor of keeping the voltage V0 of the control node of the driving element at a high level.

Figure 22A:
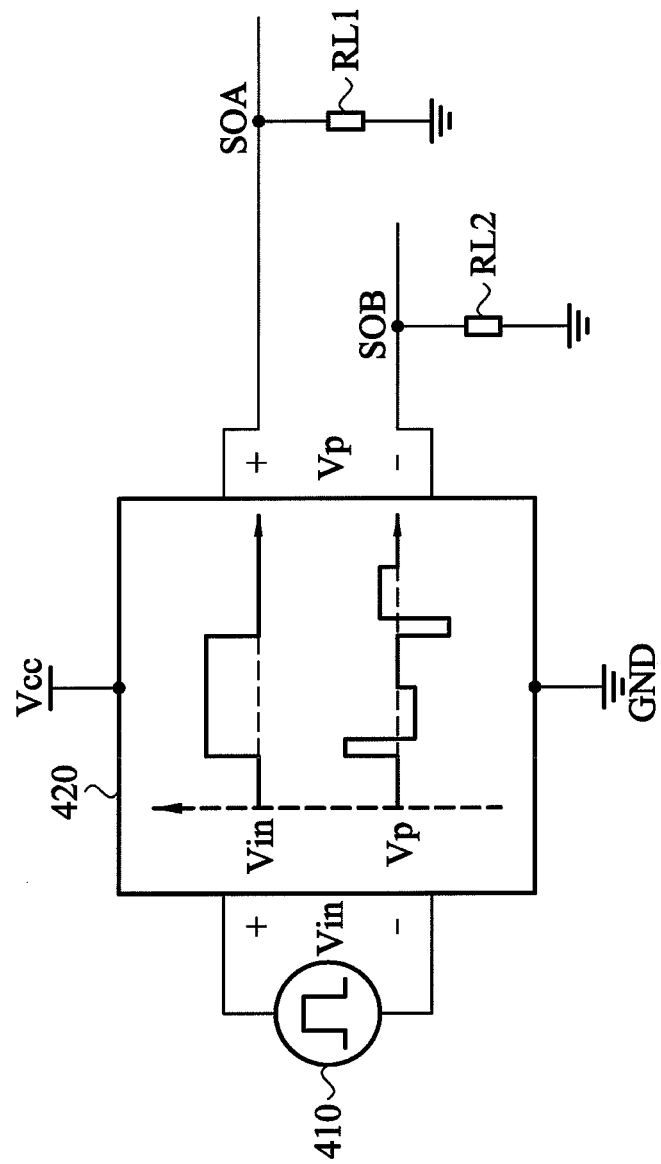
FIG. 22a is a circuit for testing pulses.
Figure 22B:
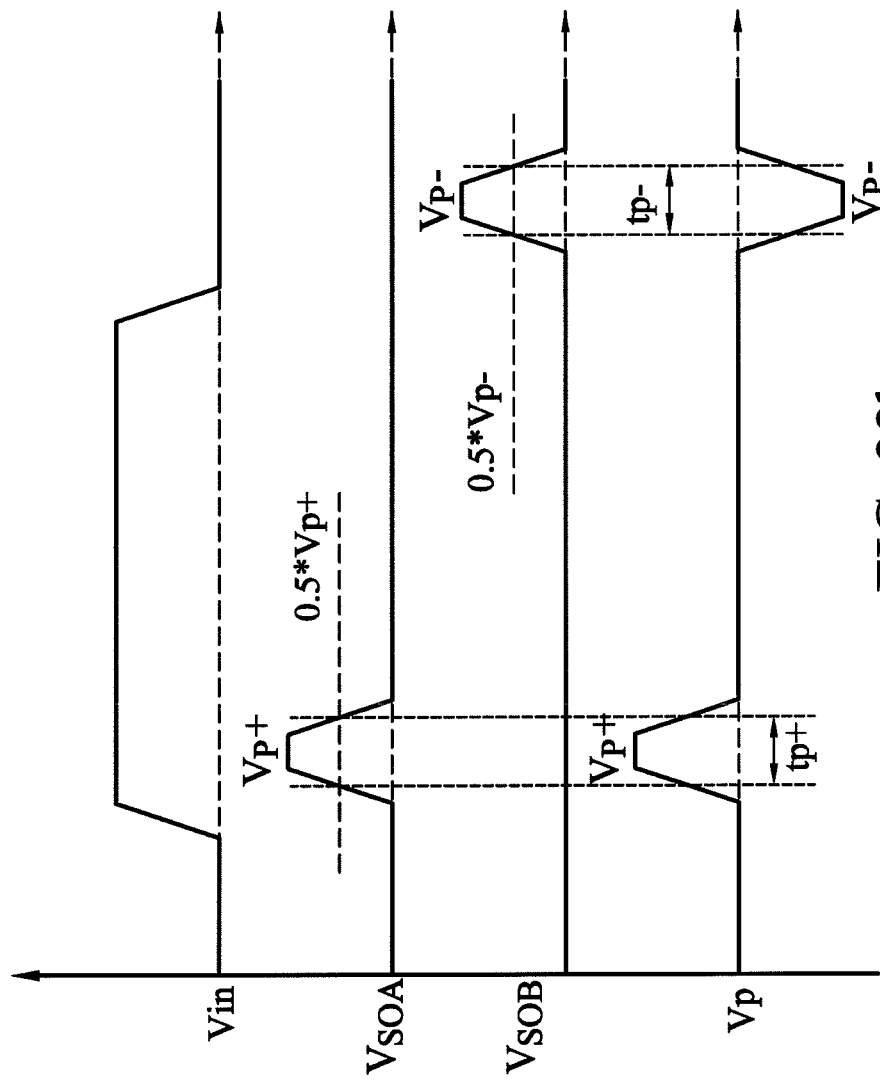
FIG. 22b is a waveform showing input and output of FIG. 22.

At t3, the square wave of the signal source 410 generates falling edges to trigger the output voltage Vp− of the first modulation circuit 420 which is kept for tp− so as to form off-pulses. The second modulation 430 outputs a low potential according to the off-pulses such that the switch device Qs is turned on quickly in favor of the voltage of the gate capacitor Ciss passing the switch device Qs to discharge to a low potential to turn off the driving element $Q_L$. When the driving element $Q_L$ is turned off at t4, the first modulation circuit 420 removes off-pulses such that the time tp− the pulses stay at the transformer T is as short as possible. Similarly, the transformer T will generate positive excitation current $i_m$ according to the positive potential off-pulses. After the off-pulses are removed, the first modulation circuit 420 outputs the recovery pulses with positive potential VR+ until the excitation current returns to zero at t6. Similarly, in order to prevent the second modulation circuit 430 from wrongly recognizing that the recovery pulses with positive potential are on-pulses to turn off the switch device Qs, the recovery pulses with potential VR+ output from the first modulation have to be lower than the threshold value VTHP+ such that the potential of the recovery pulses in the signal Vs received by the second modulation circuit 430 is also lower than the threshold value VTHS+. Hence, the output voltage VOS of the second modulation circuit 430 is certain to be at the lowest potential and lowest impedance status as possible such that the driving element $Q_L$ can be maintained at the off status. The pulse widths are tested by the first modulation circuit 420 which loads RL1 and RL2 are respectively connected between output nodes SOA, SOB and ground as FIG. 22a shows. In FIG. 22b, Vin is an input square signal; VSOA is a waveform of the output node SOA and VSOB is a waveform of the output node SOB. Vp is the output waveform of the first modulation circuit 420 as shown in FIG. 5a, i.e. wave difference between VSOA and VSOB. Accordingly, the maintained duration of the on-pulses is the width of the on-pulses tp+, i.e. positive pulse width of VSOA, which is defined as: a time interval between the corresponded time point when rising edges of the on-pulses rise to the 50% amplitude of the amplitude VP+ and the corresponded time point when falling edges of the on-pulses fall to the 50% amplitude of the amplitude VP+.

Figure 5B:
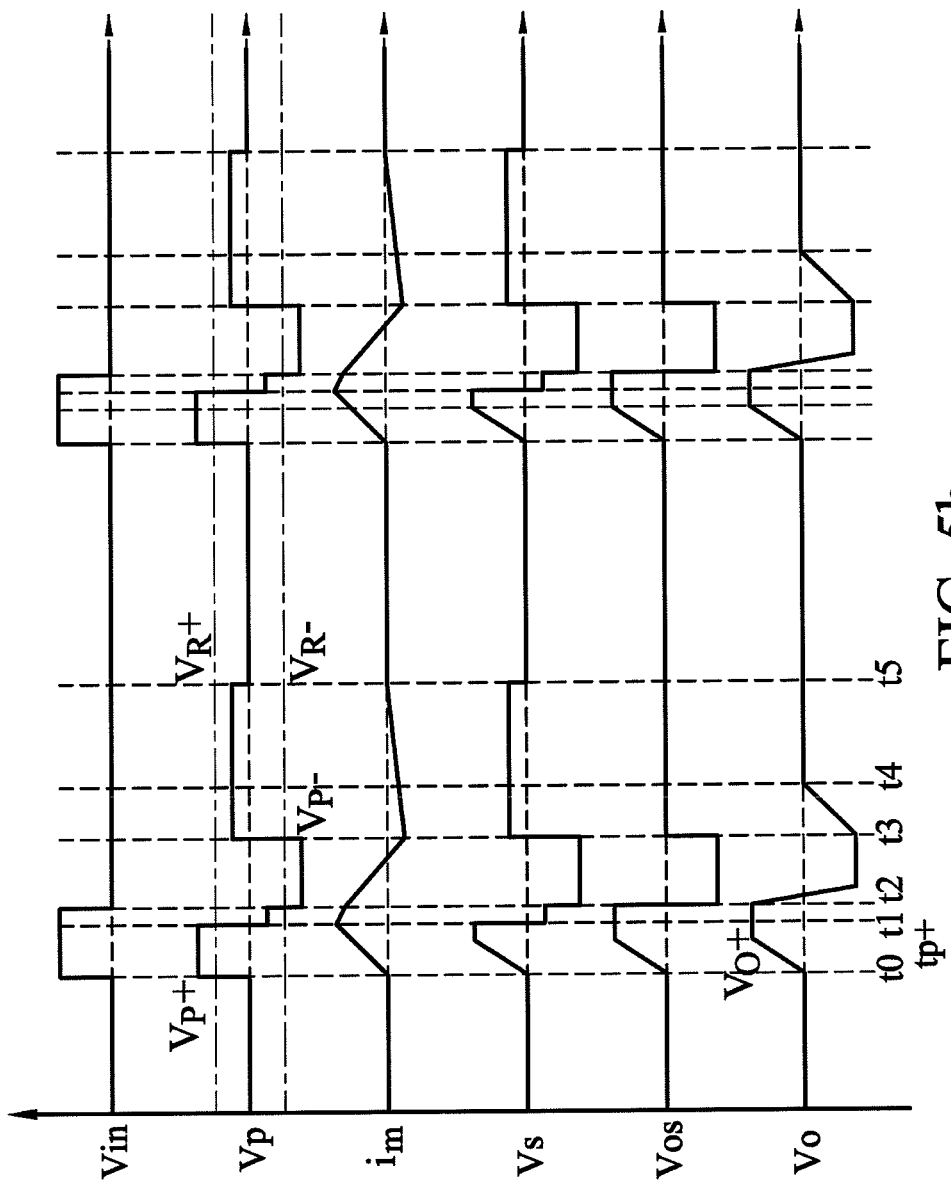
FIG. 5b is a waveform graph illustrating the driver of one embodiment of the invention when the signal source is a square wave with a low frequency and with a duty cycle of less than 50 percent.

FIG. 5b is a waveform graph illustrating the driver of one embodiment of the invention when the signal source is a square wave with a low frequency and with a duty cycle of less than 50 percent. When the high potential width of the square signal is much smaller than the low potential width thereof, such as the frequency of the square signal is 100 kHz, working time (i.e. high potential duration between t0-t2) is 2% of the working period (i.e. duty cycle is 2%), and the mechanism to employ recovery pulses to balance the excitation current of the transformer T is different from that described in FIG. 5a. Note that products of widths and amplitudes of the positive potential pulses which are supplied to the transformer T is equal to products of widths and amplitudes of the negative potential pulses which are supplied to the transformer T. As FIG. 5b shows, the duty cycle with high potential of the square wave of the signal source 410 is small such that magnetic reset (i.e. generate recovery pulses to balance excitation current) duration t1-t2 is very short. If the magnetic reset has to be completed at this time interval, then a pulse with large amplitude is needed, which would lead to erroneous driving. Therefore, it is impossible for the transformer T to carry out magnetic reset at this moment t1-t2. In FIG. 5b, a product of the width and amplitude of the on-pulses is smaller than that of the width and amplitude of the off-pulses so that negative excitation current is present. Hence, a positive recovery pulse is used at t3-t5 to balance excitation current.

Figure 5C:
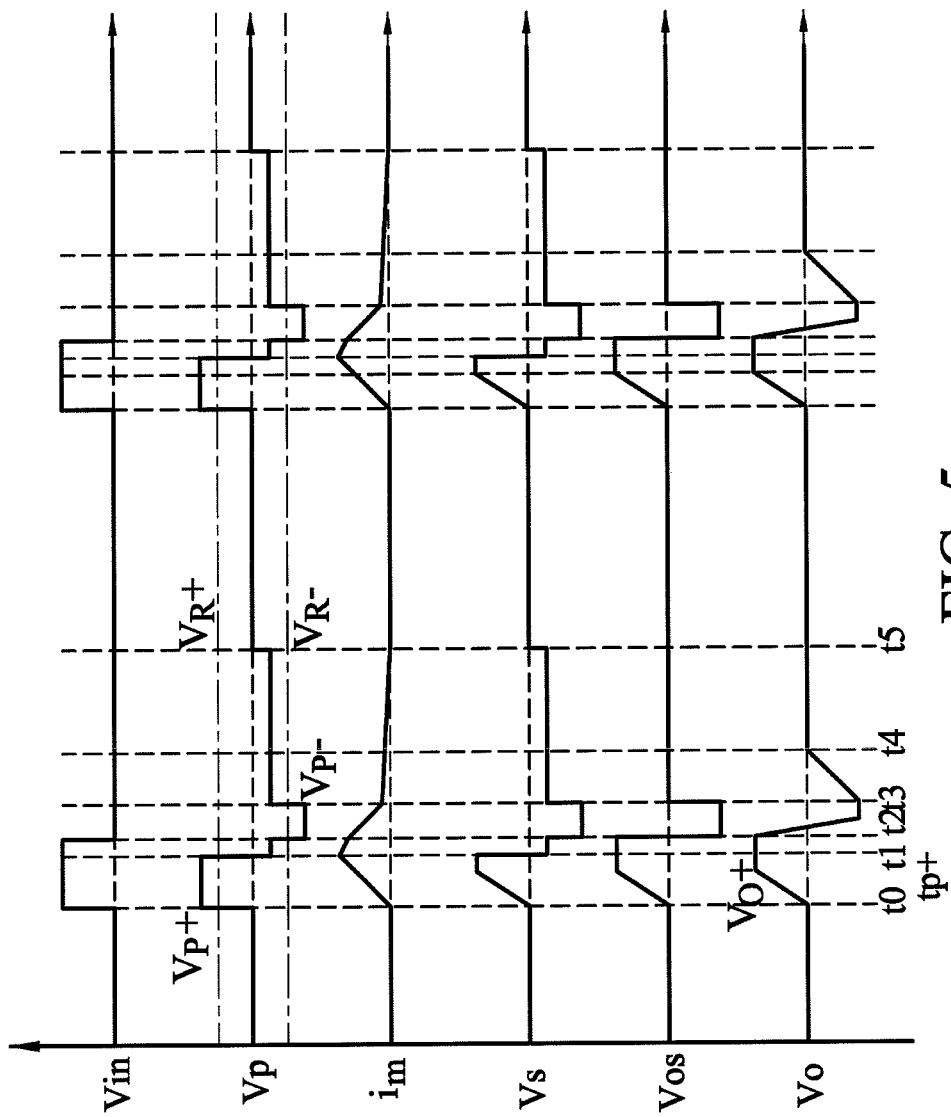
FIG. 5c is a waveform graph illustrating another embodiment of the driver of the invention when the signal source is a square wave with a low frequency and with a duty cycle of less than 50 percent.

FIG. 5c is a waveform graph illustrating another embodiment of the driver of one embodiment of the invention when the signal source is a square wave with a low frequency and with a duty cycle of less than 50 percent. The product of the width and amplitude of the on-pulses is larger than that of the width and amplitude of the off-pulses. Under this circumstance, the excitation current is positive. Hence the negative recovery pulses are used to balance the excitation current at t3-t5. If the recovery time t3-t5 is long enough, it can make sure that the transformer T can reach magnetic reset without entering a saturation status.

Figure 5D:
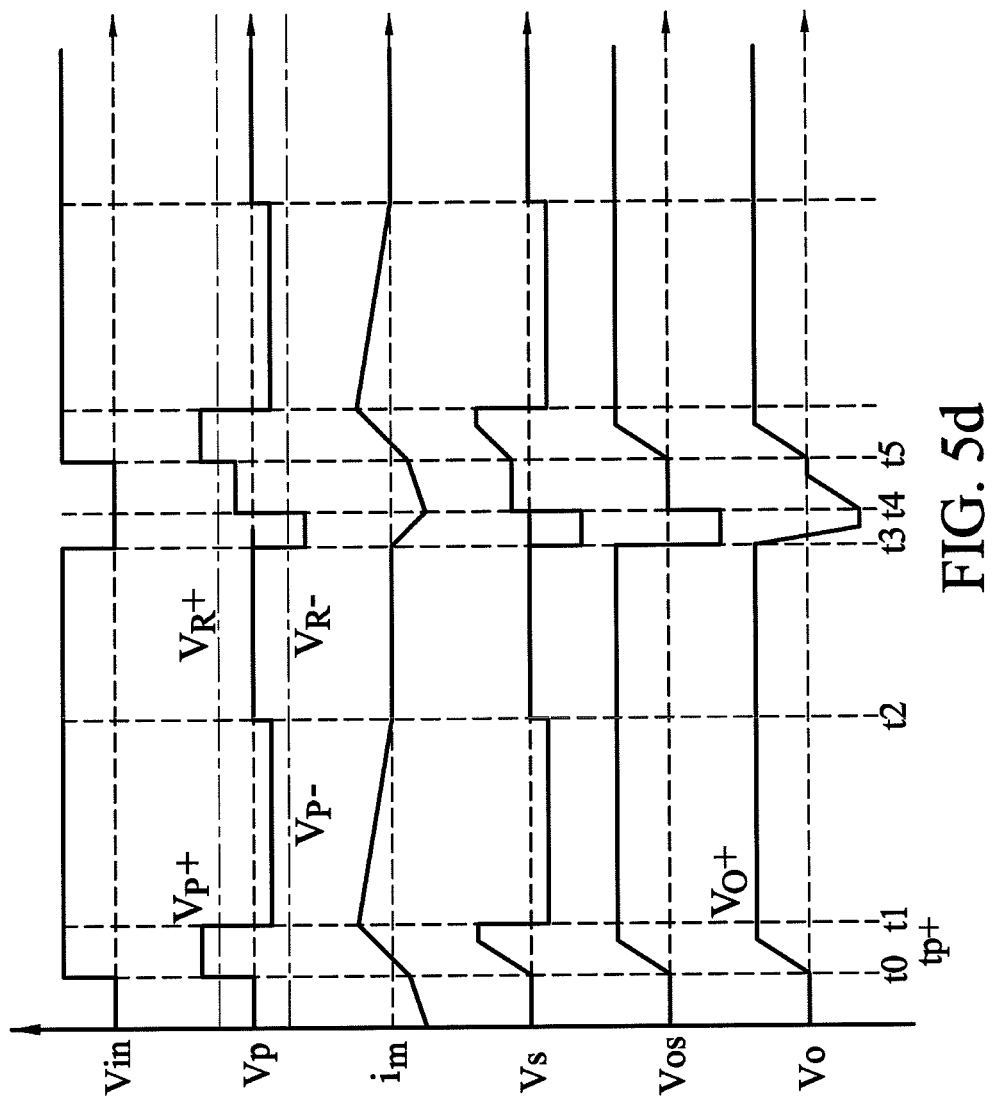
FIG. 5d is a waveform graph illustrating the driver of one embodiment of the invention when the signal source is a square wave with a low frequency and with a duty cycle of larger than a 50 percent.

FIG. 5d is a waveform graph illustrating the driver of one embodiment of the invention when the signal source is a square wave with a low frequency and with a duty cycle of larger than a 50 percent. The difference between FIG. 5b-5c and FIG. 5d is that the width with high potential of the square wave is much larger than the width with low potential of the square wave in the signal source 410. For instance, the working frequency is 100 kHz, and the working duration (be high potential at t0-t2) occupies 98% of a period (i.e. duty cycle is 98%). For this reason, the magnetic reset can not be carried out at t3-t5. Instead, the magnetic reset should be made at t1-t2. The product of the width and amplitude of the on-pulses is larger than that of the width and amplitude of the off-pulses. Therefore, a positive excitation current is generated. The negative recovery pulses are used to balance the excitation current.

Figure 5E:
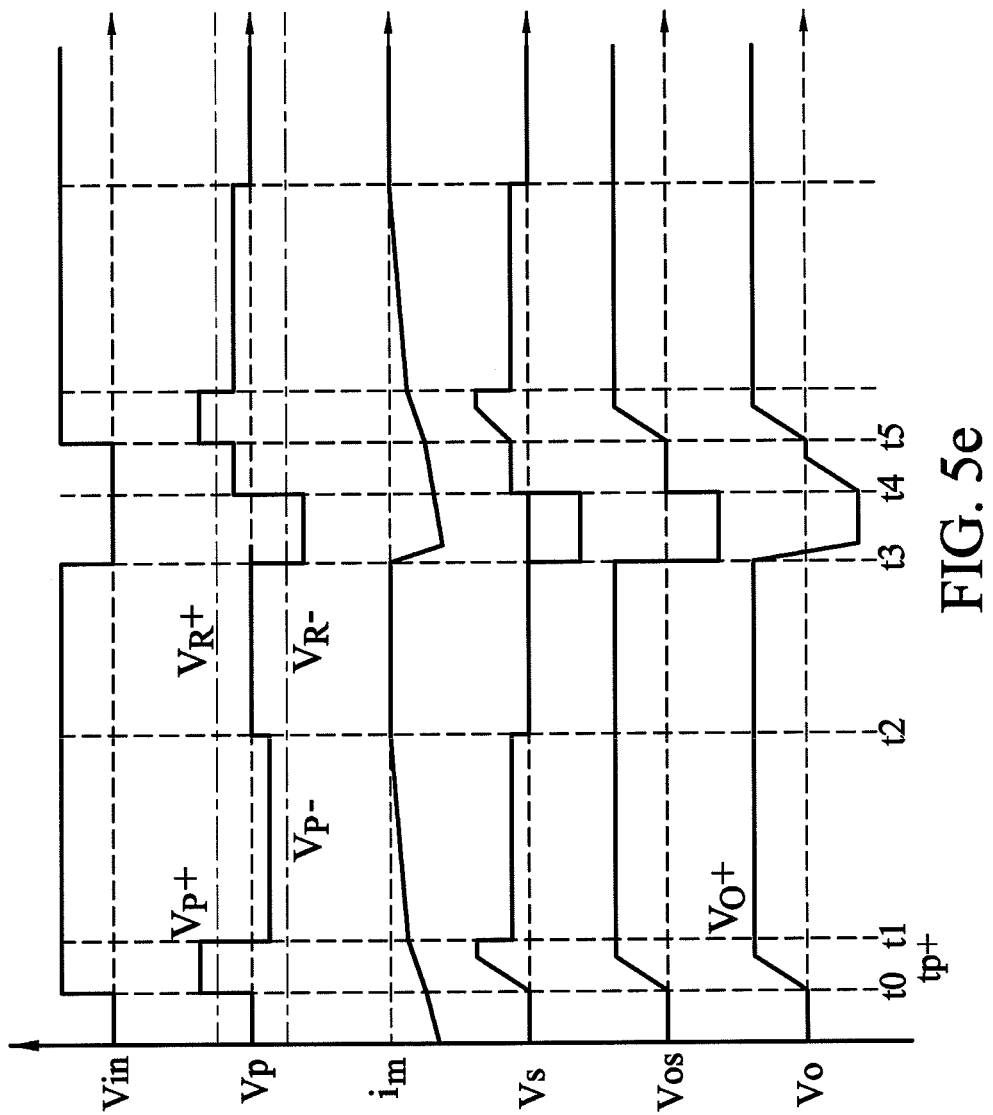
FIG. 5e is a waveform graph illustrating another embodiment of the driver of the invention when the signal source is a square wave with a low frequency and with a duty cycle of larger than a 50 percent.

FIG. 5e is a waveform graph illustrating another embodiment of the driver of the invention when the signal source is a square wave with a low frequency and with a duty cycle of larger than a 50 percent. The product of the width of the on-pulses and amplitude is smaller than that of the width of the off-pulses and amplitude. Hence, a negative excitation current is produced. The positive recovery pulses are used to balance excitation current at t3-t5.

Figure 5F:
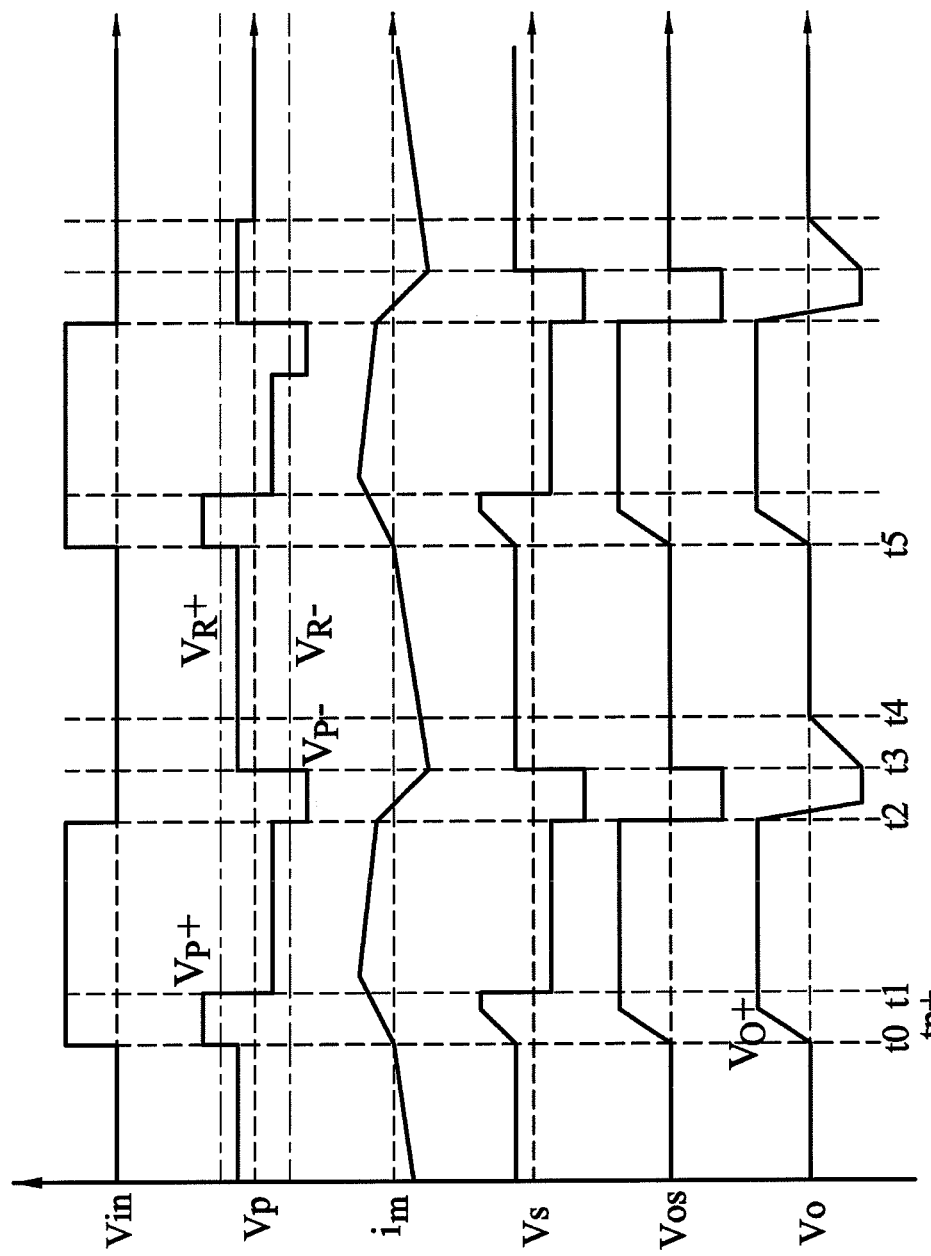
FIG. 5f is a waveform graph illustrating the driver of one embodiment of the invention when a signal source is a square wave with a high frequency and with a duty cycle of 50 percent.

FIG. 5f is a waveform graph illustrating the driver of one embodiment of the invention when a signal source is a square wave with a high frequency and with a duty cycle of 50 percent. At a high frequency, such as 1 MHz, the magnetic reset of the transformer T may be not carried out by the recovery pulses at t1-t2 and t3-t5 (i.e. the excitation current may not be returned zero. Once the on-pulses and off-pulses are not balanced, it is easy for the transformer T to reach a saturation status. For this reason, on-pulses and off-pulses have to be kept balanced in this circumstance.

Figure 6:
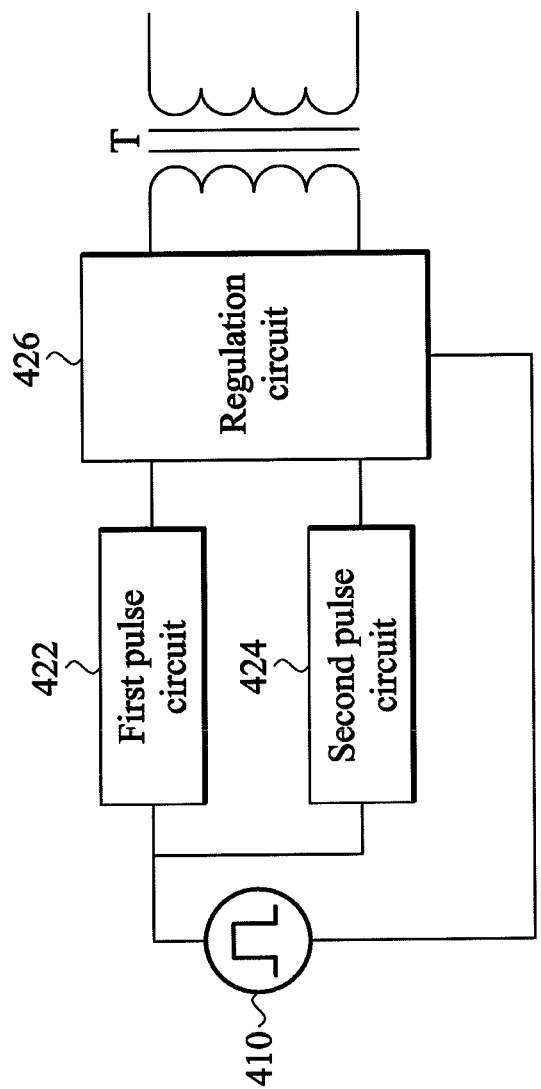
FIG. 6 is a diagram showing an embodiment of the first modulation circuit in the driver of the invention.

FIG. 6 is a diagram showing an embodiment of the first modulation circuit in the driver of the invention. The first modulation circuit 420 includes a first pulse circuit 422, a second pulse circuit 424 and a regulation circuit 426. The first pulse circuit 422 generates first pulses according to rising edges of the square signal. The second pulse circuit 424 generates second pulses according to falling edge of the square wave. The regulation circuit 426 outputs on-pulses, off pulses and one or more recovery pulses according to the first pulses and the second pulses.

Figure 7:
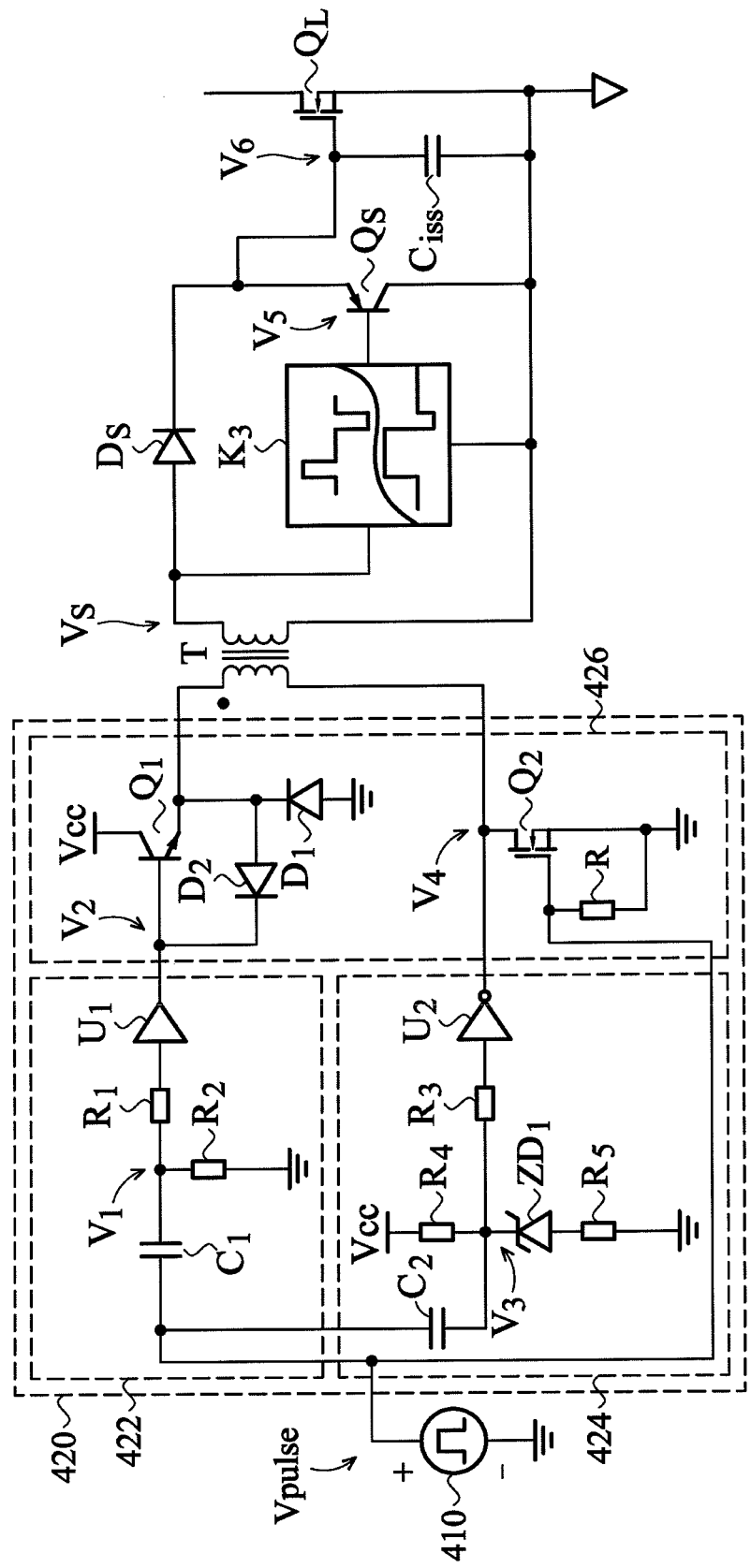
FIG. 7 is a schematic diagram showing the first modulation circuit in the driver of one embodiment of the invention.

FIG. 7 is a schematic diagram showing the first modulation circuit in the driver of the invention. The regulation circuit 426 includes a first transistor Q1 (such as an NPN BJT), a second transistor Q2 (such as an NMOS transistor), a first diode D1 and a second diode D2. The control node of the first transistor Q1 is coupled to the first pulse circuit 422, a first node of the first transistor Q1 is coupled to the DC source Vcc, and the second node of the first transistor Q1 is coupled to the first node of the primary winding of the transformer T. The first diode D1 is coupled between the second node of the first transistor Q1 and the ground. The second diode D2 is coupled between the control node and the second node of the first transistor Q1. The control node of the second transistor Q2 is coupled to the signal source 410, the first node of the second transistor Q2 is coupled to the second pulse circuit 424 and the second node of the primary winding of the transformer T, and the second node of the second transistor Q2 is coupled to the ground. Here, the first diode D1 should be a quick recovery diode and even more a shockly diode. For illustrative purposes, take the driving scheme of FIG. 5b as an example. At t1, after the on-pulses of the first modulation circuit disappear, because the excitation current can be changed immediately, the excitation current will pass through the first diode D1, the ground, the second transistor Q2 and the transformer T which form a bypass loop. At t2, the first modulation circuit 420 outputs off-pulses, because the bypass current through the first diode D1 is still flowing such that a reverse recovery effect occurs so that extra consumption is raised and driving efficiency is reduced.

The first pulse circuit 422 includes a non-inverter U1 (such as a buffer), a first resistor R1, a second resistor R2 and a first capacitor C1. The input node of the non-inverter is coupled to the first resistor R1 and the output node of the non-inverter outputs the first pulses. The second resistor R2 is coupled between another node of the first resistor R1 and the ground. The first node of the first capacitor C1 is coupled to the signal source 410 and the second node of the first capacitor C1 is coupled to the first resistor R1 and the second resistor R2. Not taking the threshold voltage effect of the non-inverter into consideration, the first capacitor C1, the first resistor R1 and the second resistor R2 determine the width of the first pulses (also determined the width of the on-pulses).

The second pulse circuit 424 includes an inverter U2, a second capacitor C2, a third resistor R3, a fourth resistor R4, a fifth resistor R5 and a first regulator device ZD1 (such as a Zener diode). The input node of the inverter U2 is coupled to the third resistor R3, the output node of the inverter U2 outputs the second pulses. The first node of the second capacitor C2 is coupled to the signal source 410, and the second node of the second capacitor C2 is coupled to the third resistor R3. The first node of the fourth resistor R4 is coupled to the second node of the second capacitor C2 and the second node of the fourth resistor R4 is coupled to the DC source Vcc. The first regulator device ZD1 is connected to the resistor R5 in series, and is disposed between the second node of the second capacitor C2 and the ground. Not taking the threshold voltage effect of the inverter into consideration, the second capacitor C2, the third resistor R3, the fourth resistor R4 and the fifth resistor R5 determine the width of the second pulses (also determines the width of the off-pulses).

Figure 8:
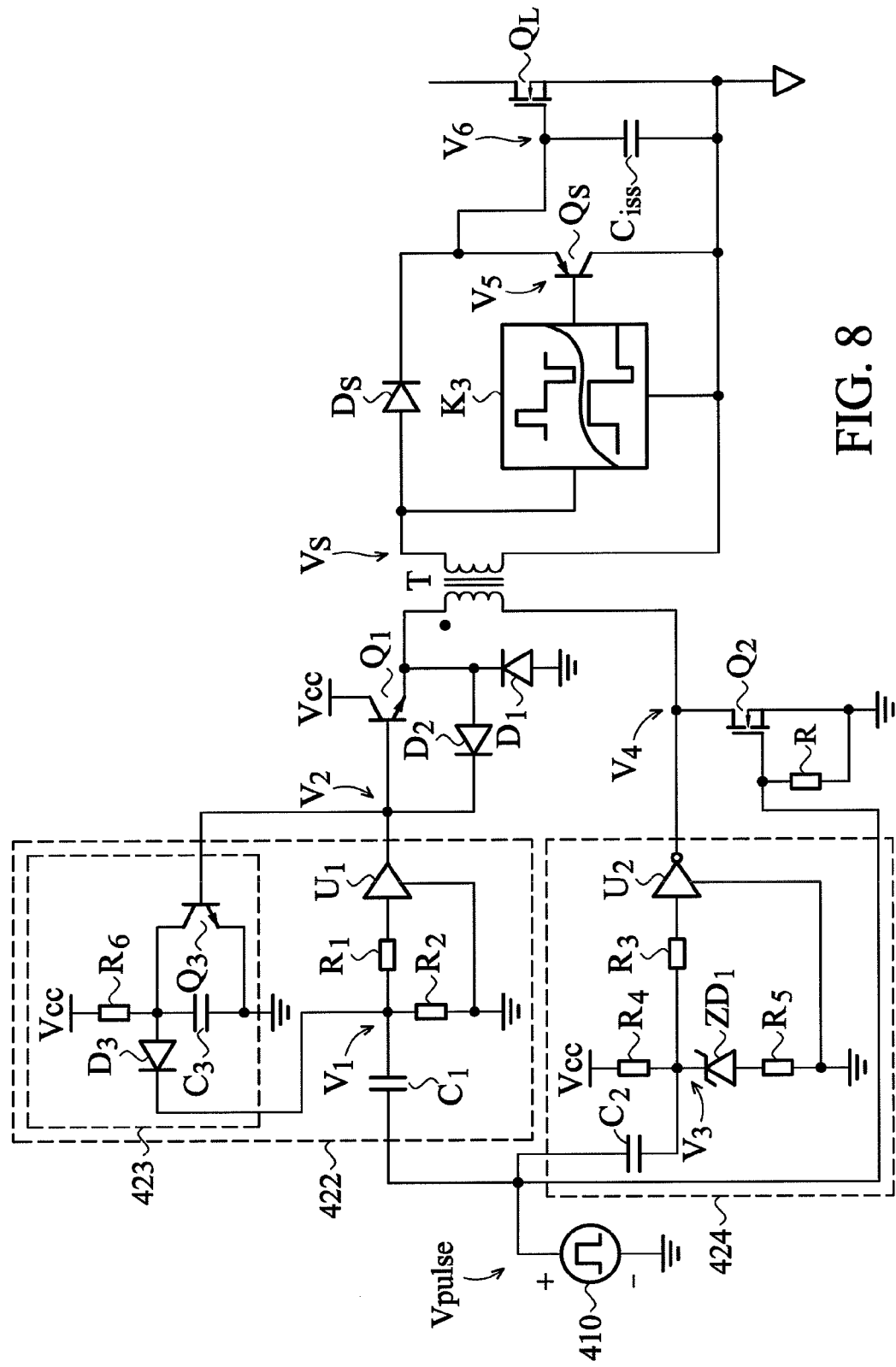
FIG. 8 is a schematic diagram showing another embodiment of the first modulation circuit of the invention.

FIG. 8 is a schematic diagram showing another embodiment of the first modulation circuit of the invention. In the embodiment, a first keep circuit 423 is added into the first pulse circuit 422. The first keep circuit 423 is used to make the first modulation circuit 420 send the on-pulses intermittently for maintaining the high potential of the gate of the driving element $Q_L$ to keep the driving element $Q_L$ turned on when a high potential width of the square signal is longer. The first keep circuit 423 includes a third transistor Q3 (such as an NPN BJT), a third capacitor C3, a third diode D3 and a sixth resistor R6. The control node of the third transistor Q3 is coupled to the output node of the non-inverter U1, the first node of the third transistor Q3 is coupled to the DC source Vcc through the sixth resistor R6 and the second node of the third transistor Q3 is coupled to the ground. The third capacitor C3 is coupled between the first node and the second node of the third transistor Q3. The third diode D3 is coupled to the second node of the first capacitor C1 and the first node of the third transistor Q3.

Figure 9:
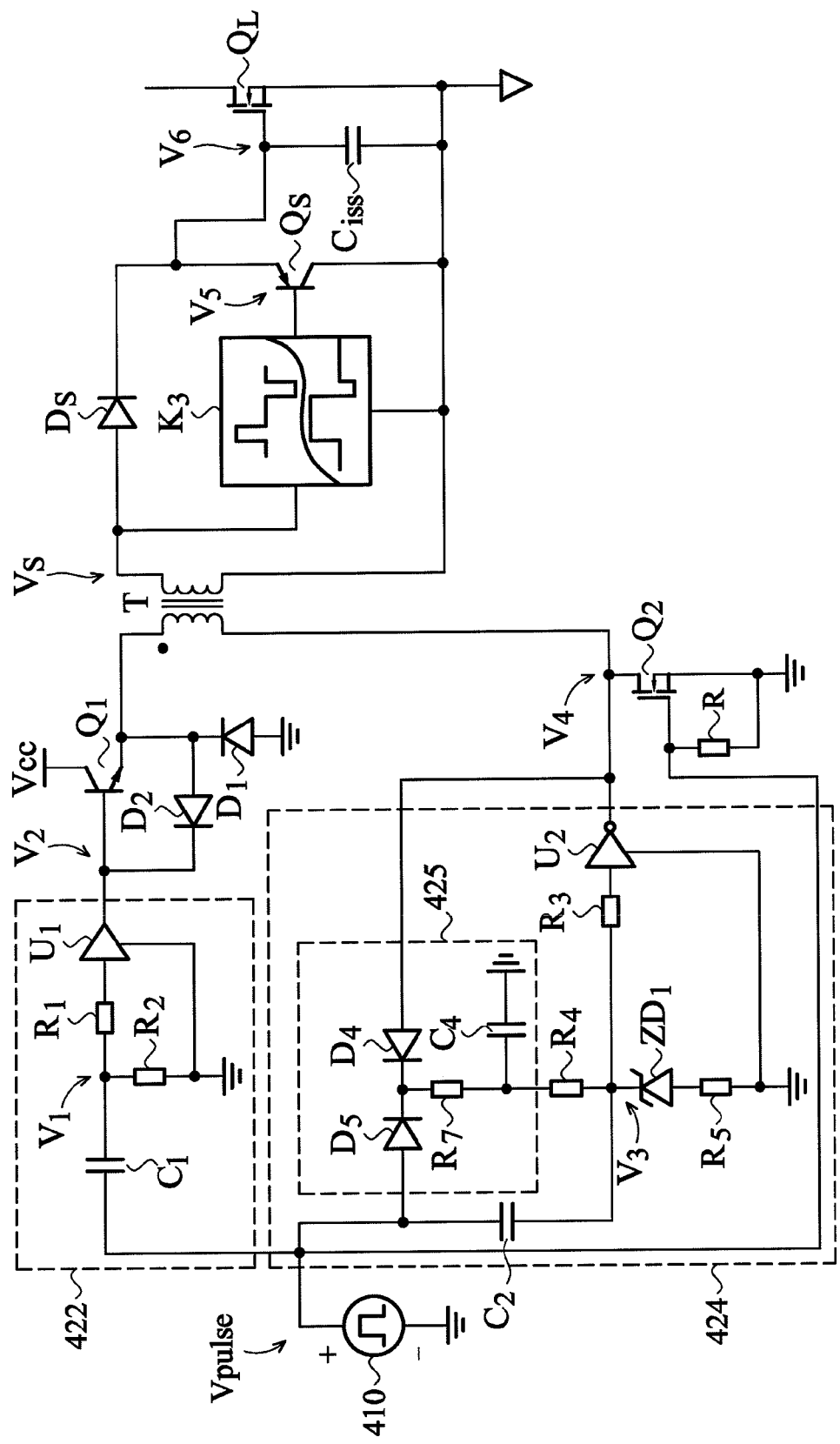
FIG. 9 is a schematic diagram showing another embodiment of the first modulation circuit of the invention.

FIG. 9 is a schematic diagram showing another embodiment of the first modulation circuit of the invention. In the embodiment, a second keep circuit 425 is added into the second pulse circuit 424. The second keep circuit 425 is used to send the off-pulses intermittently for keeping the switch device Qs turned on to make the gate of the driving element QL to be a low potential and low impedance status. The second keep circuit 425 includes the fourth diode D4, the fifth diode D5, the seventh resistor R7 and the fourth capacitor C4. The first node of the fourth diode D4 is coupled to the signal source 410 through the fifth diode D5 and the second node of the fourth diode D4 is coupled to the output node of the inverter U2. The first node of the seventh resistor R7 is coupled to the fourth resistor R4 and the second node of the seventh resistor R7 is coupled to the first node of the fourth diode D4.

Figure 10:
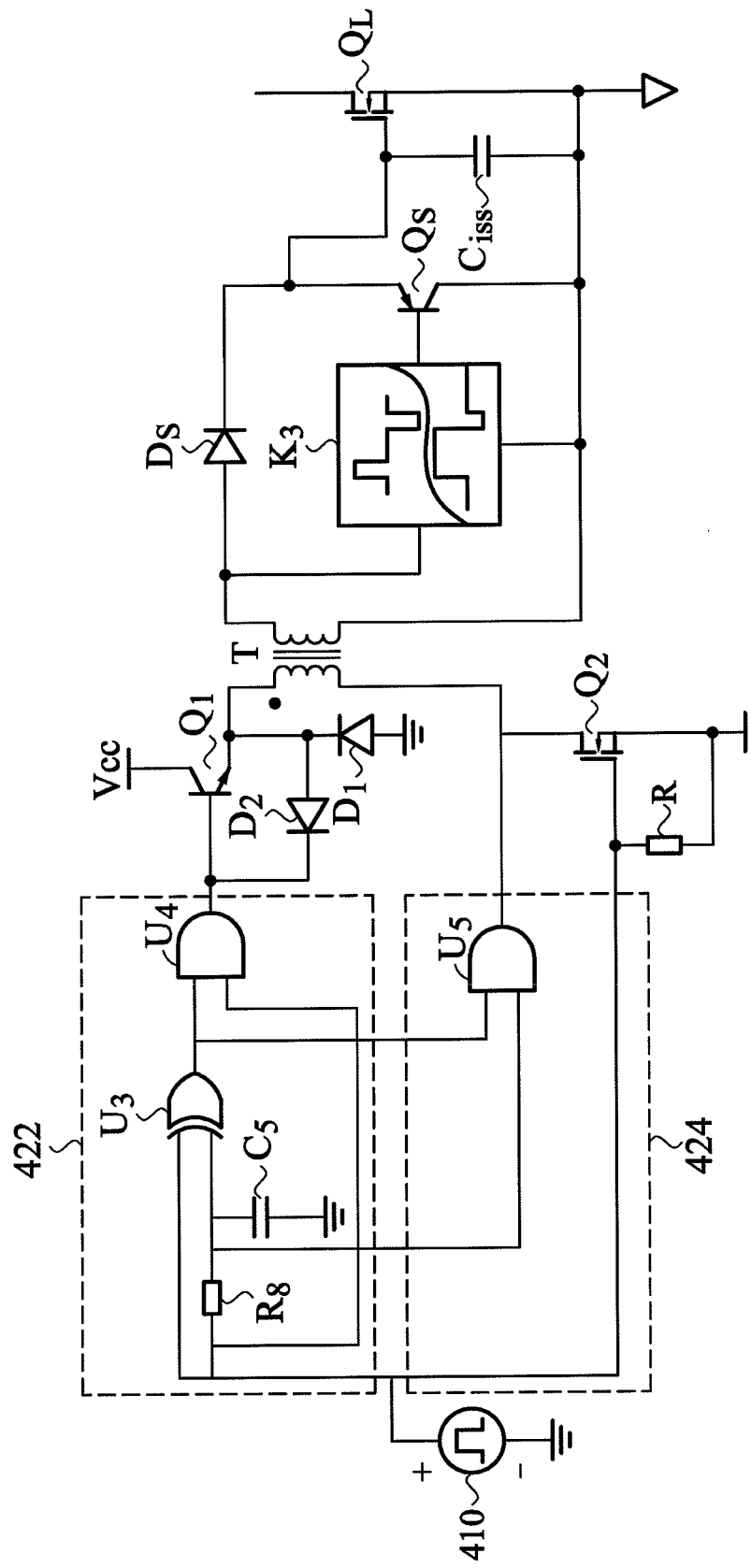
FIG. 10 is a schematic diagram showing another embodiment of the first modulation circuit of the invention.

FIG. 10 is a schematic diagram showing another embodiment of the first modulation circuit of the invention. The first pulse circuit 422 includes an XOR gate U3, an eighth resistor R8, a fifth capacitor C5 and a first AND gate U4. The first input node of the XOR gate U3 is coupled to the signal source 410. The eight resistor R8 is coupled between the first input and the second input of the XOR gate U3. The fifth capacitor C5 is coupled to the second input of the XOR gate U3 and the ground. The first AND gate U4, has a first input node coupled to the output of the XOR gate, the second node coupled to the signal source 410 and a output node outputting the first pulses.

The second pulse circuit 424 includes a second AND gate U5. The first input node of the second AND gate U5 is coupled to the output node of the XOR gate U3, the second input is coupled to the second input node of the XOR gate U3 and the output node outputs the second pulses. Not taking the threshold voltage effect of U3, U4 and U5 into consideration, the eighth resistor R8 and the fifth capacitor C5 determine width of on-pulses and width of off-pulses.

Figure 11:
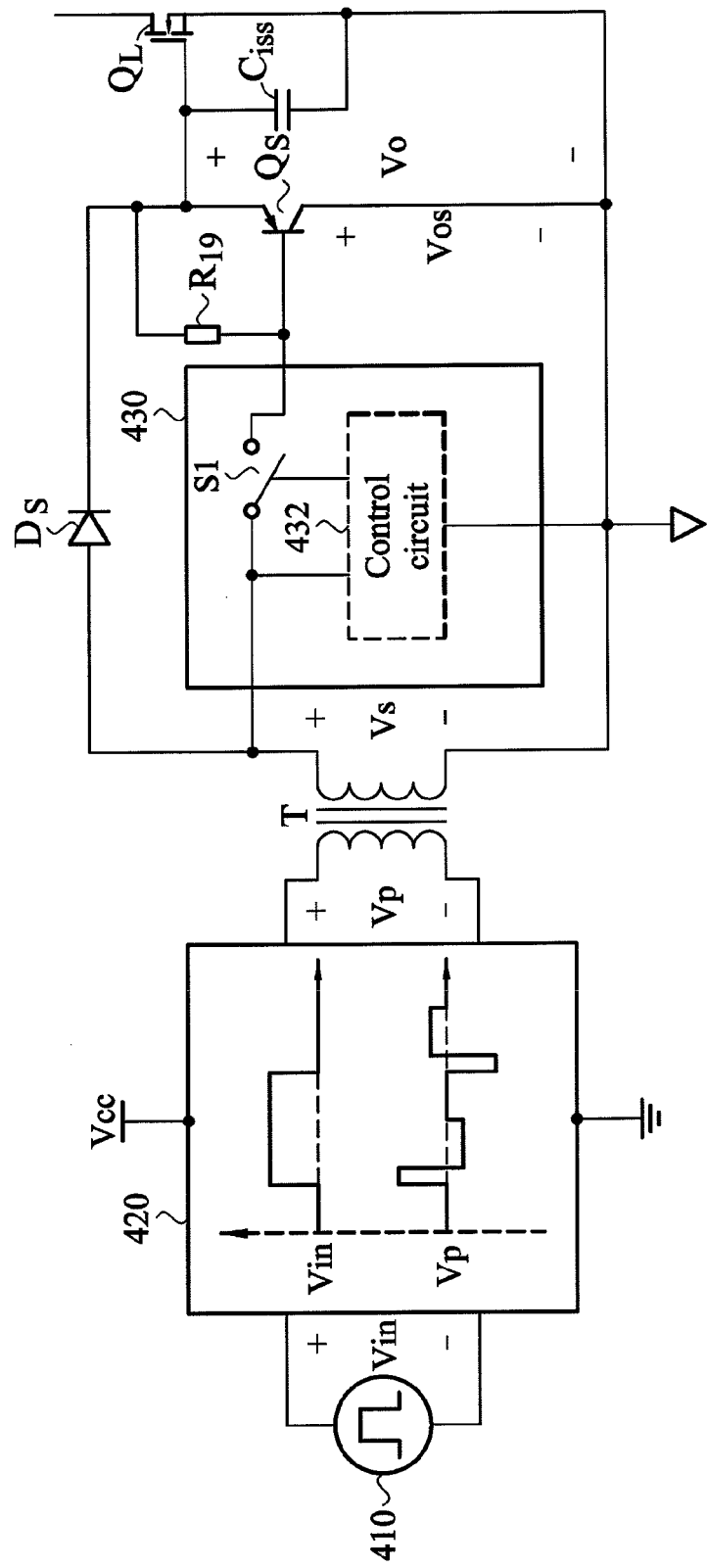
FIG. 11 is a diagram showing an embodiment of the second modulation circuit of the invention.

FIG. 11 is a diagram showing an embodiment of the second modulation circuit of the invention. The second modulation circuit 430 includes a switch circuit S1 and a control circuit 432. The first node of the switch circuit S1 is coupled to the first node of the secondary winding of the transformer T and the second node of the switch circuit S1 is coupled to the control node of the switch device Qs. The first node of the control circuit 432 is coupled to the first node of the switch circuit S1, and the second node of the control circuit 432 is coupled to the control node of the switch circuit S1. The control circuit 432 is used to control the switch circuit S1. In the embodiment, the switch circuit S1 is a switch element. When the control circuit 432 receives the on-pulses, the first node and the second node of the switch circuit S1 is cut off (i.e. turn off the switch element S1). The second node of the switch circuit S1 is kept at a high potential. At this moment, the control node of the switch device Qs is floating, so that a resistor Rs may be connected between the control node and the first node of the switch device Qs to make sure that the switch device Qs is turned off. Note that if there is leakage current when the switch device Qs is turned off, the resistor Rs can bypass the leakage current. After the control circuit 432 receives the off-pulses, the control circuit 432 controls the switch circuit S1 to be turned on.

Figure 12A:
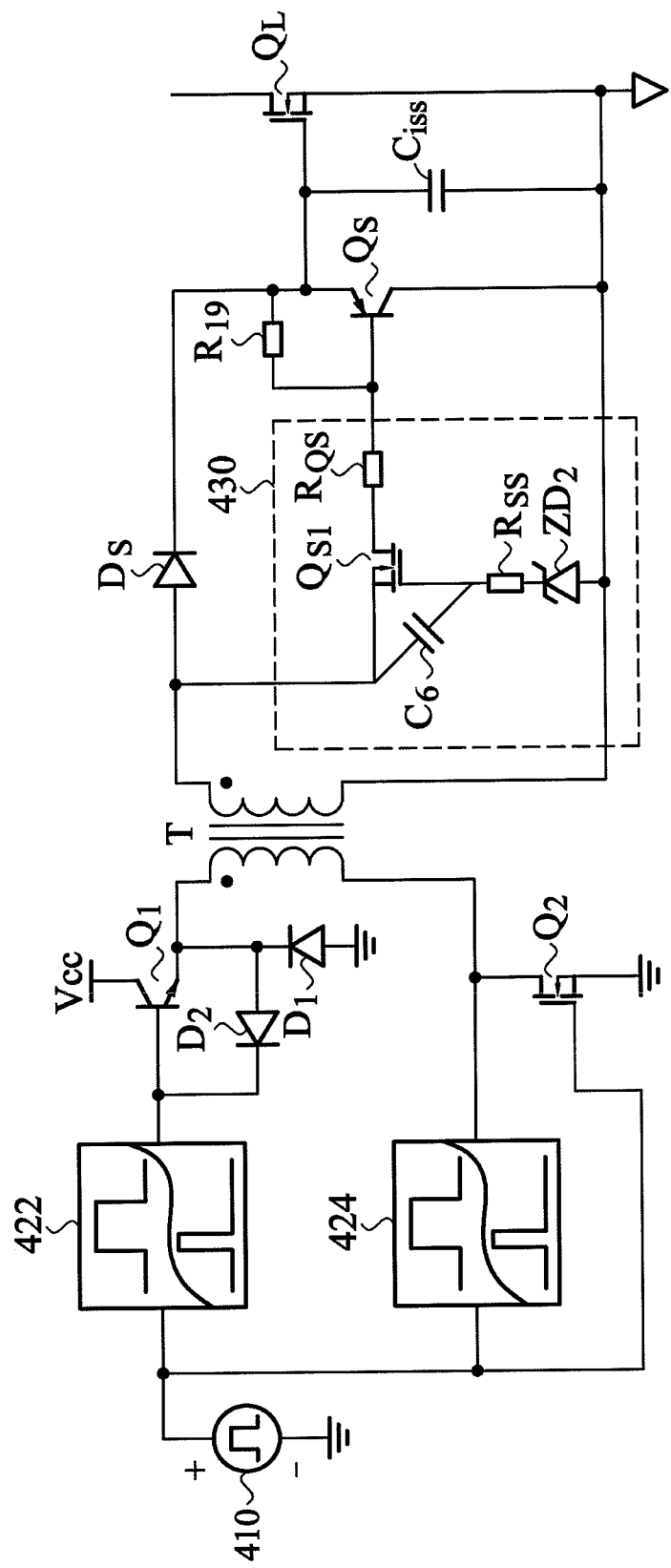
FIG. 12a is a schematic diagram showing an embodiment of the second modulation circuit of the invention.

FIG. 12a is a schematic diagram showing an embodiment of the second modulation circuit of the invention. The second modulation circuit 430 includes a first tri-node switch element QS1 (such as an NMOS transistor), a second regulator ZD2 (such as a Zener diode), a sixth capacitor C6, series resistor $R_{SS}$ and current-limit resistor $R_{QS}$. The control node of the tri-node element QS1 is coupled to the second node of the secondary winding of the transformer T through the second regulator ZD2 (such as a Zener), the first node is coupled to the first node of the secondary winding of the transformer T and the second node is coupled to the control node of the switch device Qs. The sixth capacitor C6 is coupled to the control node and the first node of the first tri-node switch element QS1. The sixth capacitor may be parasitic capacitor or outer capacitor. The control node of the first tri-node switch element $Q_{S1}$ is coupled to the second regulator ZD2 through a series resistor Rss to control the charging speed of the sixth capacitor C6 located between the gate and the source of the first tri-node element QS1. In order to prevent the current in the loop, including the switch device Qs, the first tri-node switch element and the transformer T, from becoming larger, a current-limit resistor $R_{QS}$ is disposed between the control node of the switch device Qs and the second node of the first tri-node switch element $Q_{S1}$.

Figure 12B:
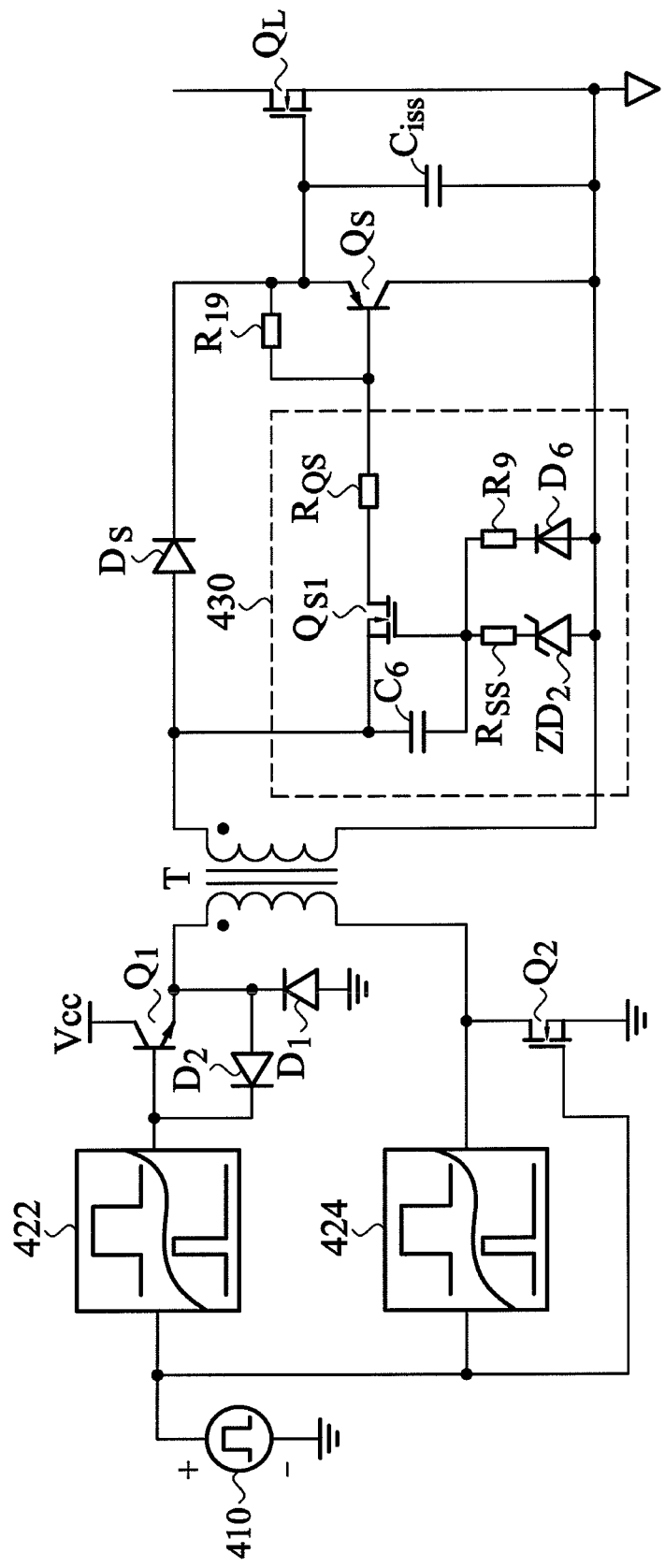
FIG. 12b is a schematic diagram showing another embodiment of the second modulation circuit of the invention.

FIG. 12b is a schematic diagram showing another embodiment of the second modulation circuit of the invention. The difference between FIG. 12a and FIG. 12b is that the second modulation circuit 430 further includes the ninth resistor R9 and the sixth diode D6. The resistance of the ninth resistor R9 is smaller than that of the series resistor Rss. The above main purpose is to appropriately increase the current which is caused when coupled off-pulses charge a capacitor located between the gate and the source of the first tri-node switch element $Q_{S1}$. The driving element QL can be turned off even if the amplitudes and the widths of the off-pulses are smaller, and the driving element is kept at a low potential and low impedance status before the on-pulses are generated.

Figure 13:
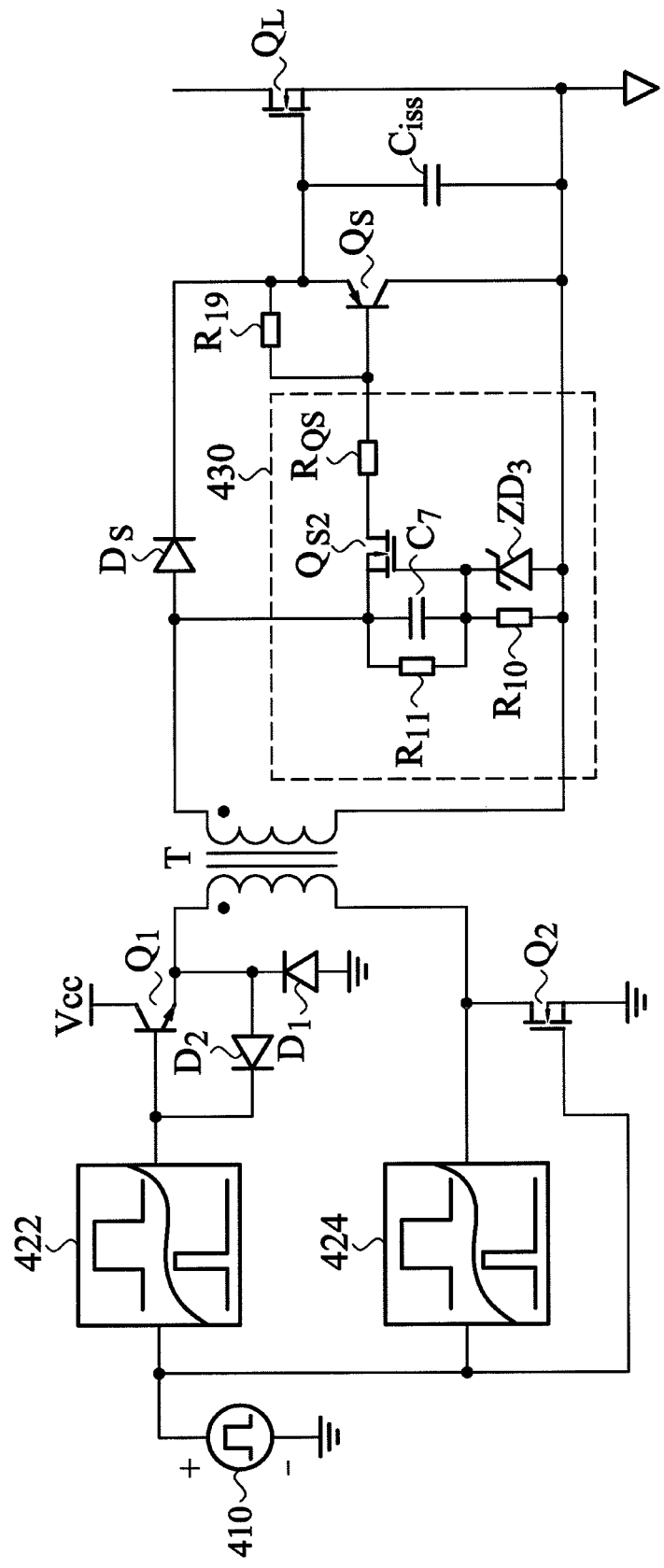
FIG. 13 is a schematic diagram showing another embodiment of the second modulation circuit of the invention.

FIG. 13 is a schematic diagram showing another embodiment of the second modulation circuit of the invention. The second modulation circuit 430 includes a second tri-node switch element QS2 (such as an NMOS transistor), a third regulator ZD3 (such as a Zener diode), a tenth resistor R10, a eleventh resistor R11, a seventh capacitor C7 and current-limit resistor $R_{QS}$. The second tri-node switch element QS2 has a control node coupled to the second node of the secondary winding of the transformer T through the third regulator ZD3, a first node coupled to the first node of the secondary winding of the transformer T and the second node coupled to the control node of the switch device Qs through the resistor $R_{QS}$. The tenth resistor R10 is connected to the third regulator ZD3 in parallel. The eleventh resistor R11 is connected to the seventh capacitor C7 in parallel, coupled between the control node and the first node of the second tri-node switch element QS2.

Figure 14:
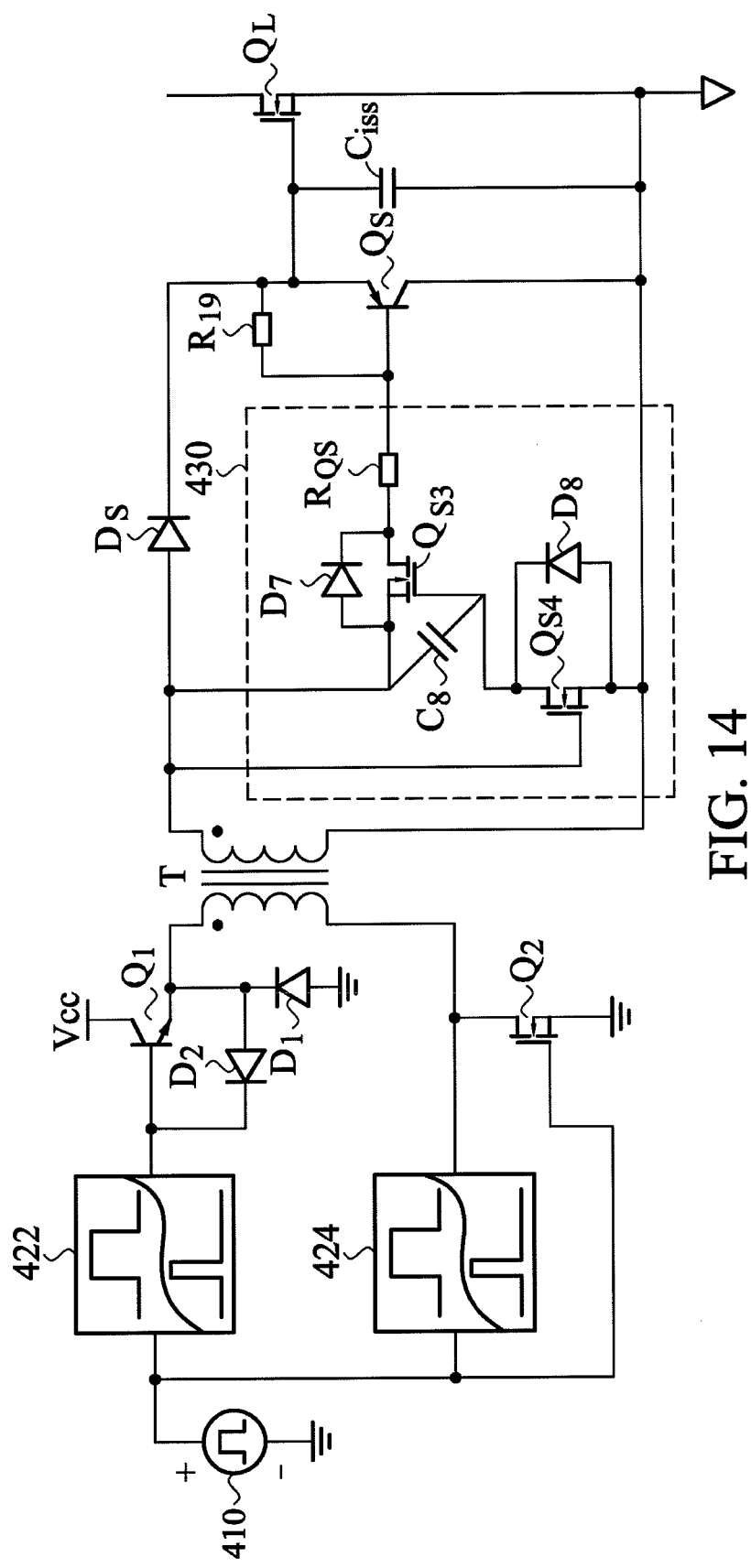
FIG. 14 is a schematic diagram showing another embodiment of the second modulation circuit of the invention.

FIG. 14 is a schematic diagram showing another embodiment of the second modulation circuit of the invention. The second modulation circuit 430 includes a tri-node switch element QS3 (such as an NMOS transistor), an eighth capacitor C8 and a fourth tri-node switch element QS4 (such as an NMOS transistor). The first node of the third tri-node switch element QS3 is coupled to the first node of the secondary winding of the transformer T and the second node of the third tri-node switch element QS3 is coupled to the control node of the switch device Qs. The fourth tri-node switch element QS4 has a first node coupled to the control node of the third tri-node switch element QS3, a control node coupled to the first node of the secondary winding of the transformer T and a second node coupled to the second node of the secondary winding of the transformer T. The eighth capacitor C8 is coupled to the first node and the control node of the third tri-node switch element QS3. The first node of the fourth tri-node switch element QS4 is coupled to the control node of the third tri-node switch element QS3 through a resistor (not shown) to control the charging speed of the eighth capacitor C8 located between the gate (control node) and source (first node) of the third tri-node switch element QS3. Moreover, a seventh diode D7 and an eighth diode D8 are respectively connected in parallel between the first node and the second node of the third tri-node switch element QS3 and the fourth tri-node switch element QS4. The seventh diode D7 and the eighth diode D8 may be inside diodes of switch elements or outside diodes.

Figure 15:
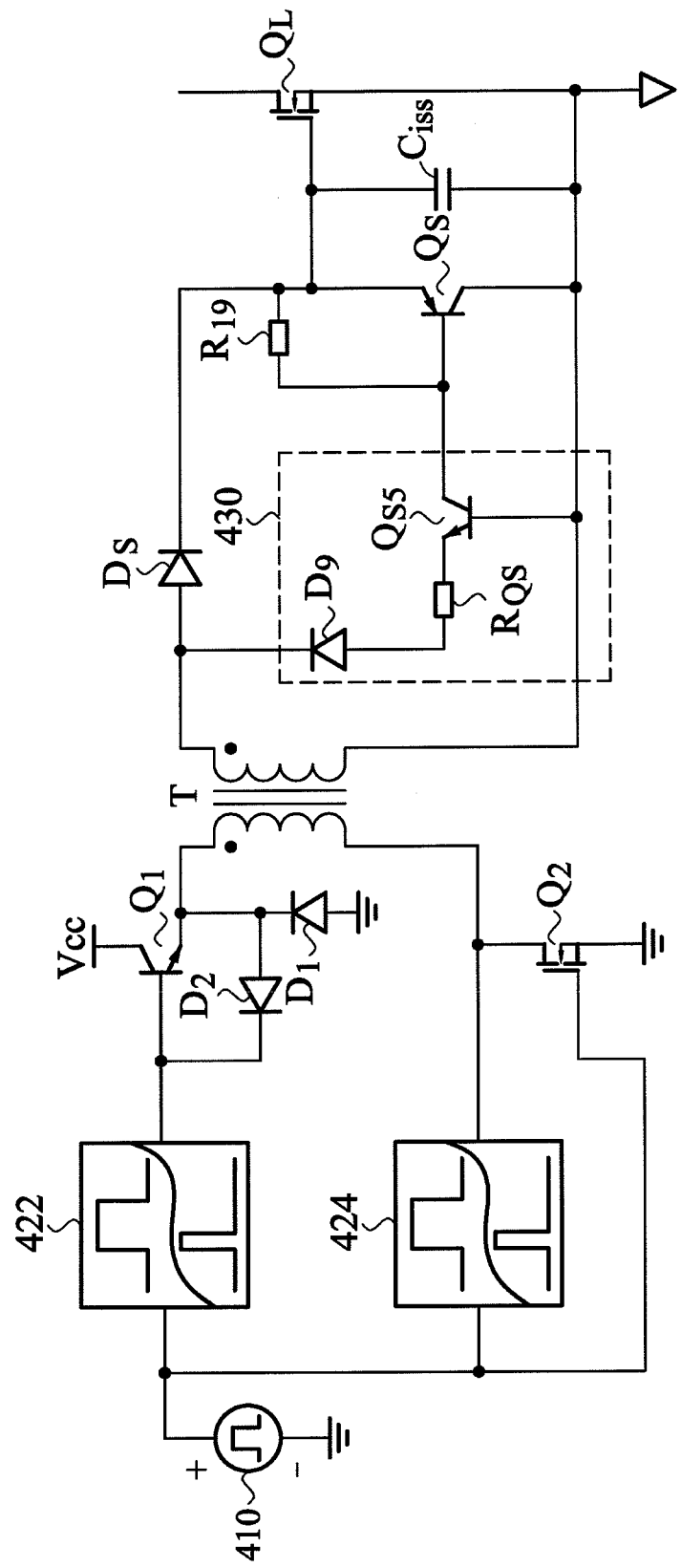
FIG. 15 is a schematic diagram showing another embodiment of the second modulation circuit of the invention.

FIG. 15 is a schematic diagram showing another embodiment of the second modulation circuit of the invention. The second modulation circuit 430 includes a fifth tri-node switch element QS5 (such as an NPN BJT), a resistor $R_{QS}$ and a ninth diode D9. The first node of the fifth tri-node switch element QS5 is coupled to the control node of the switch device Qs, the second node is coupled to the first node of the secondary winding of the transformer T through the ninth diode D9, and the control node is coupled to the second node of the secondary winding of the transformer T.

Figure 16:
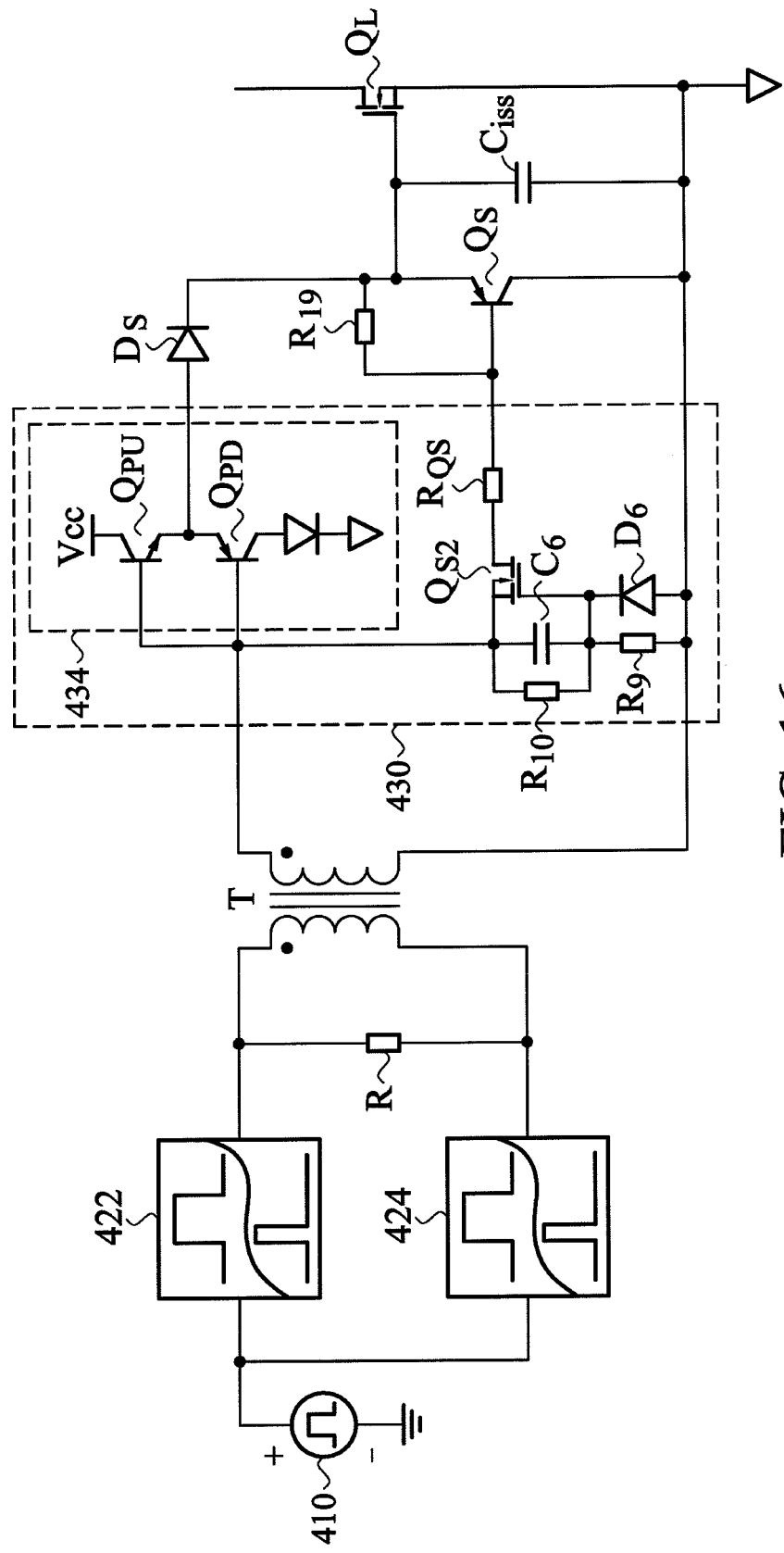
FIG. 16 is a schematic diagram showing another embodiment of the driver of the invention.

FIG. 16 is a schematic diagram showing another embodiment of the driver of the invention. A push-pull circuit 434 is added into the second modulation circuit 430, which is disposed between the first node of the secondary winding of the transformer T and the unidirectional on-device Ds. In the embodiment, the push-pull circuit 434 is made up of a NPN transistor, a PNP transistor and a diode in series. The power required by the secondary winding of the transformer T is provided by the push-pull circuit 434. Therefore, the transformer T only delivers signals rather than power so that winding power consumption is eliminated.

Figure 17A:
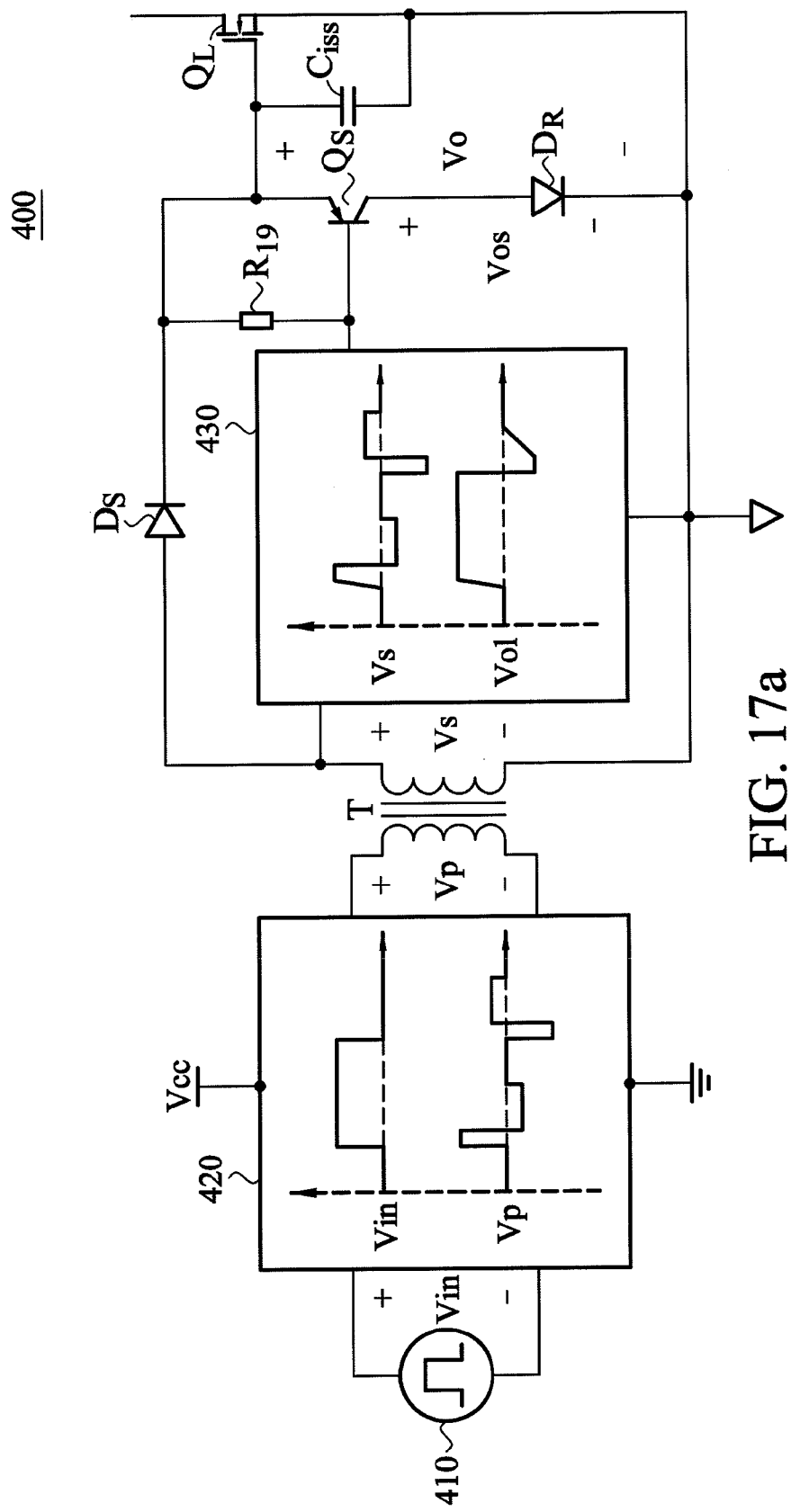
FIG. 17a is a diagram showing another embodiment of the driver of the invention.

FIG. 17a is a diagram showing another embodiment of the driver of the invention. The driver 400 further adds a diode element $D_R$ with one node connected to one node of the switch device Qs of the secondary winding and another node connected to one node of the driving element $Q_L$ such that the switch device Qs become a unidirectional switch device used to prevent from being turned on by the reverse voltage to slow down the discharge of the voltage Vo with negative potential at the gate of the driving element QL during the turn-off period. Hence, the negative potential of the gate capacitor Ciss may be maintained longer to enhance cut-off driving of the driving element QL. Furthermore, a nineteenth resistor R19 is connected between the unidirectional on device Ds and the control node of the switch device Qs. Taking the switch device Qs of PNP BJT as an example, the waveforms Vo and Vo(1) respectively represent waveforms before and after the diode element $D_R$ is added thereto. The diode element $D_R$ extends recovery time from t5 to t5'. Without the diode element $D_R$, when the voltage Vo of the gate capacitor Ciss of the driving element QL is a negative potential and the off-pulses of the secondary winding of the transformer T are removed, the charges of the gate capacitor Ciss will be quickly released through a parasitic diode of the switch device Qs. The diode element $D_R$ may block the parasitic diode of the switch device Qs from being turned on. The discharge loop of the negative voltage has to pass through the secondary winding of the transformer T, so that leakage inductance of the winding can prolong discharging time of the negative voltage from t5 to t5'.

Figure 17B:
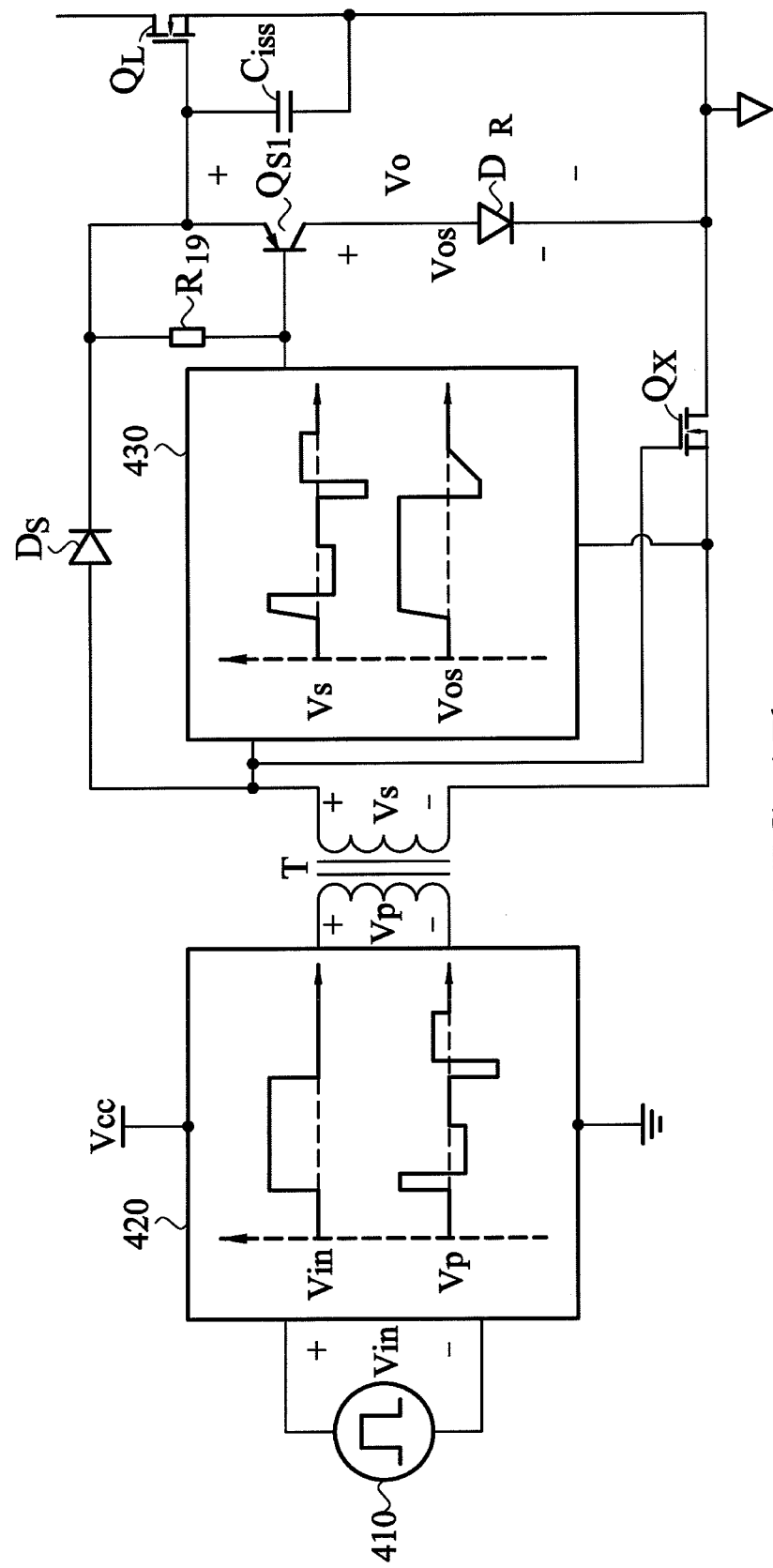
FIG. 17b is a diagram showing another embodiment of the driver of the invention.
Figure 17C:
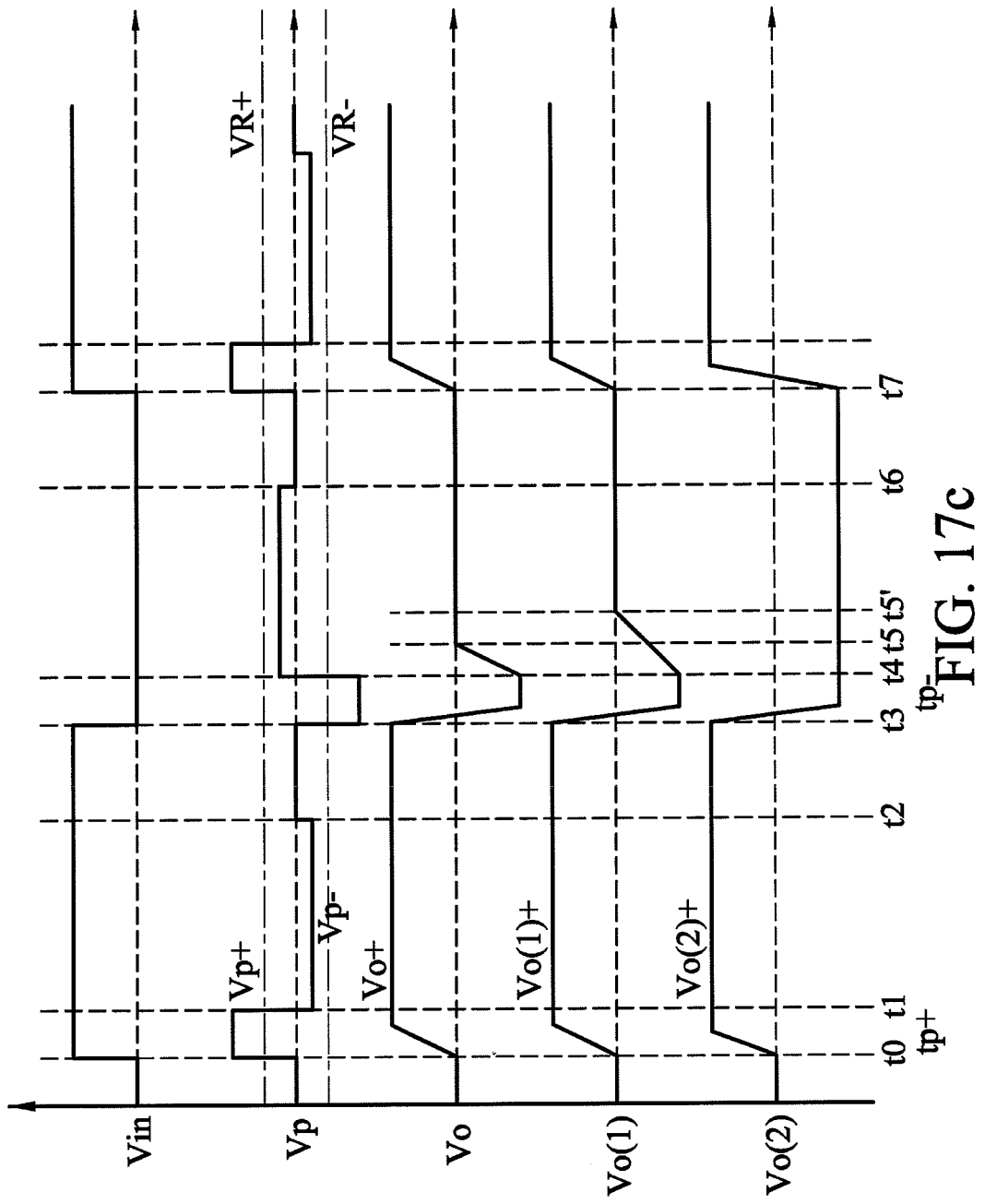
FIG. 17c is a waveform diagram showing embodiments of FIG. 17a-17b.

FIG. 17b is a diagram showing another embodiment of the driver of the invention. A bidirectional switch component Qx is added into the circuit of FIG. 17a. The bidirectional switch component Qx may be an NMOS, but is not limited thereto. The above purpose is to keep the gate of the driving element $Q_L$ at a negative potential for a long time after the driving element QL is turned off to increase anti-interference capacity. When the voltage of the on-pulses, coupled to the secondary winding of the transformer T, exceeds the threshold voltage of the bidirectional switch component Qx, the bidirectional switch component Qx is turned on. The bidirectional switch component Qx is turned off when the voltage of the off-pulses, coupled to the secondary winding of the transformer T, exceeds the threshold voltage of the bidirectional switch component Qx. When the absolute value of the amplitude of the coupled pulses is larger than the absolute value of VTHS−, the second modulation circuit 430 determines that the coupled pulses are off-pulses. At the same time, the discharging process of the driving element $Q_L$ is identical to that of the circuit shown in the FIG. 4 and the driving voltage of the gate is negative. The difference is that after the off-pulses are removed, because the bidirectional switch component Qx is at a turn-off status, the negative voltage of the gate of the bidirectional switch component Qx is maintained. The other embodiments of the invention are also adapted to the circuit shown in FIG. 17b.

Figure 18A:
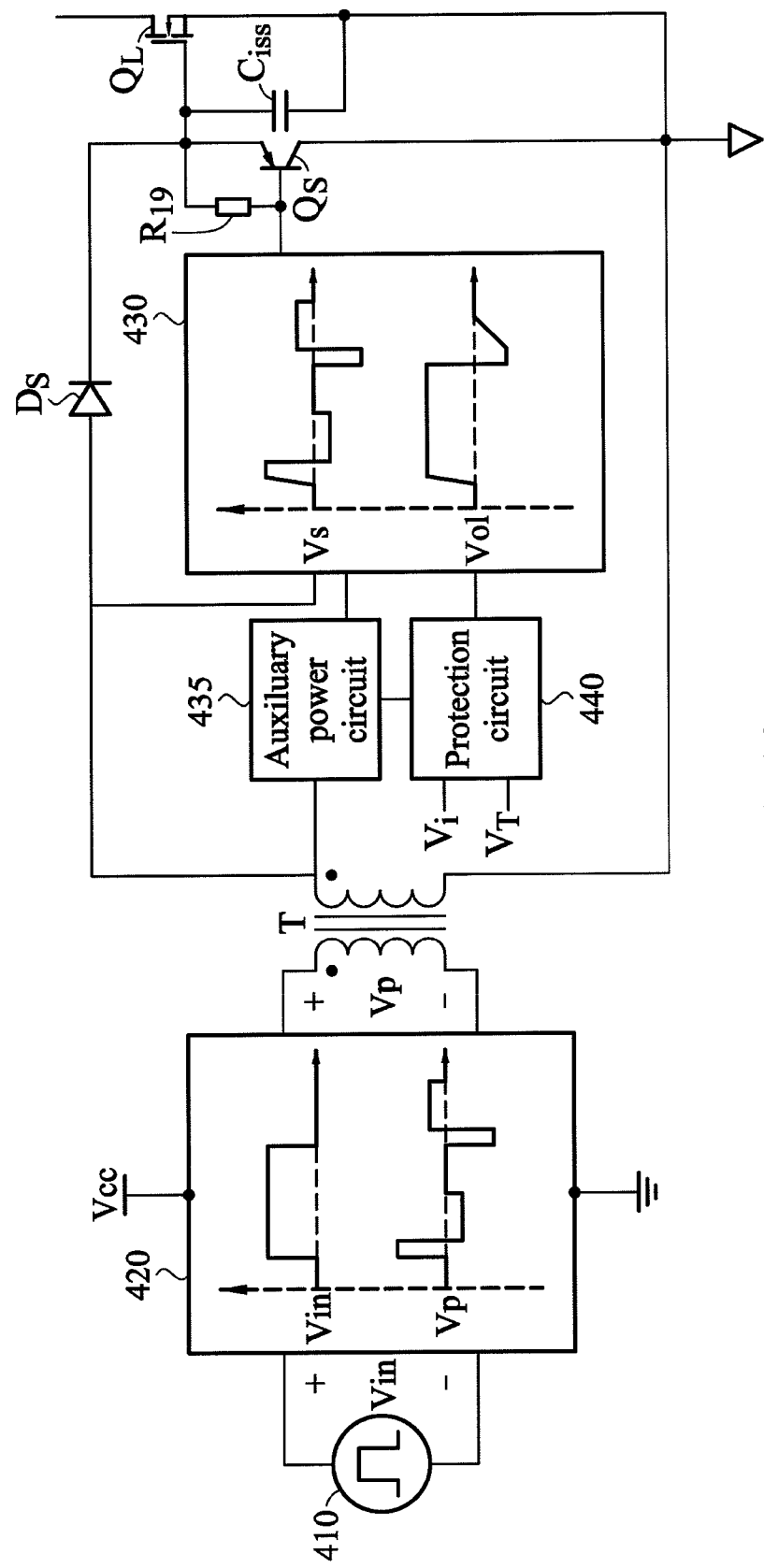
FIG. 18a is a diagram showing another embodiment of the driver of the invention.

FIG. 18a is a diagram showing another embodiment of the driver of the invention. Based on the circuit of FIG. 4, the second modulation circuit 430 further includes an auxiliary power circuit 435 and a protection circuit 440. In order to protect the circuit or limit breakdown consumption, an over-current protection circuit and an over-heat protection circuit etc. are necessary. However, costs are increased for implementation. For example, an over-current protection circuit samples current messages of some elements by current transformers, wherein the current messages are provided to the control circuits. The control circuits deliver control messages to isolation driving circuits according to the current messages to turn off some elements. In this manner, costs are increased and the size of the transformers is larger, which may lead to off-signals not being delivered in time due to driving delay.

As FIG. 18a shows, the current message Vi which passes through the driving element $Q_L$ may be sampled by a current transformer CT or by detecting the voltage drop of the driving element QL. A temperature message $V_T$ may be obtained by a temperature detection device such as an NTC sensor thermistor. A comparison circuit (such as a comparator) in the protection circuit 440 respectively compares the current message Vi and temperature message with the corresponding reference signals, and then sends the results to the second modulation circuit 430. If the current message Vi shows that the current which flows through the driving element $Q_L$ exceeds a predetermined value, then after the second modulation circuit 430 receives a protection signal, it produces a signal to the switch device Qs so as to quickly turn off the driving element $Q_L$. Note that the auxiliary power circuit 435 is connected to the secondary winding of the transformer T. The energy of the power source is delivered to a capacitor through a diode. In this manner, the energy of the capacitor can be provided to the protection circuit 440 or other circuits of the secondary winding of the transformer T, such as the second modulation circuit 430.

Figure 18B:
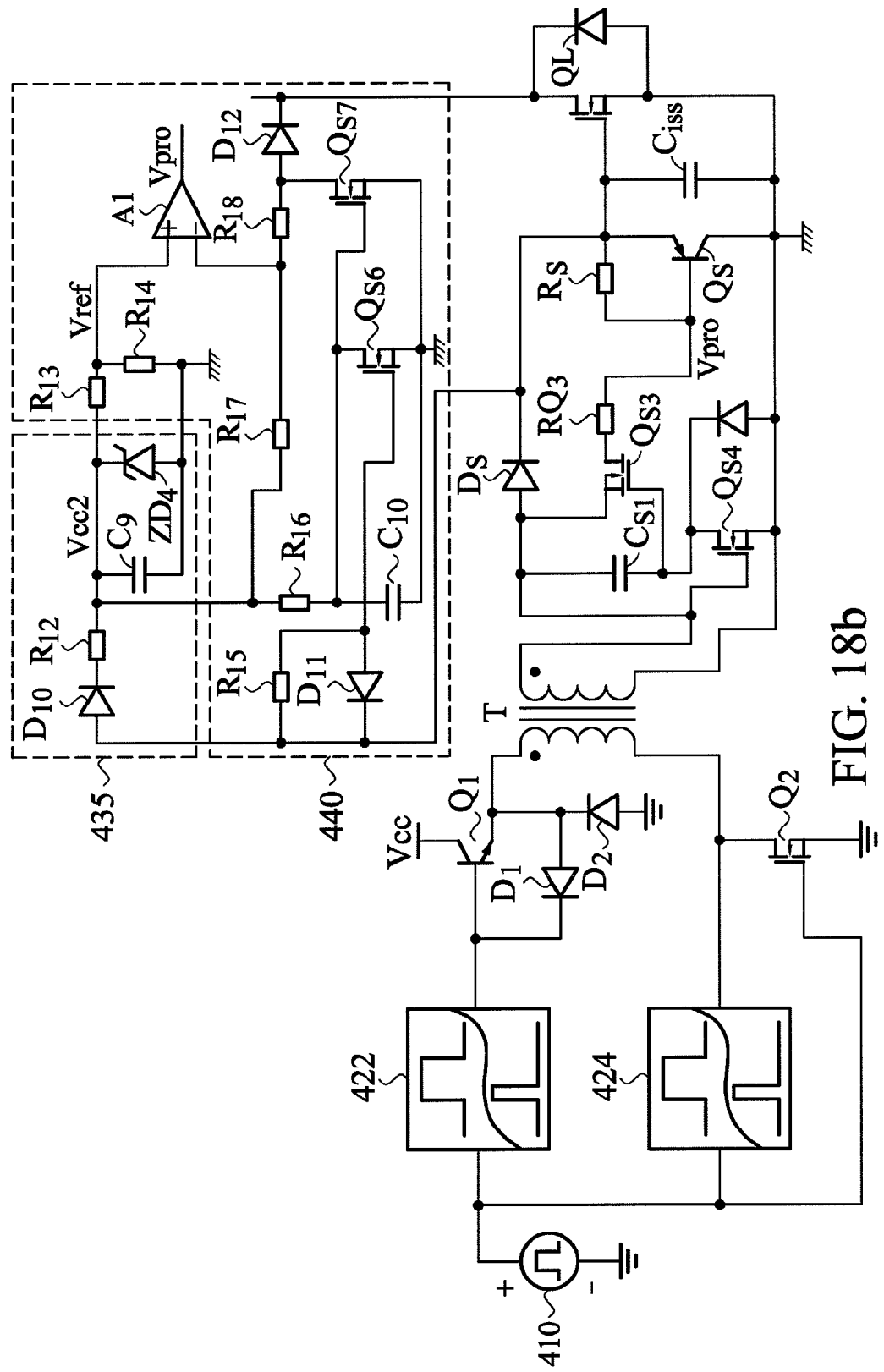

FIG. 18b is an embodiment of a protection circuit in FIG. 18a. The auxiliary power circuit 435, which is made up of a twelfth diode D10, a twelfth resistor R12, a ninth capacitor C9 and a fourth regulator ZD4 (such as a Zener diode), is used to supply power to the comparator A1 in the protection circuit 440. The power voltage is divided by the thirteenth resistor R13 and the fourteenth resistor R14 to provide a reference voltage Vref to the non-inverting node of the comparator A. The circuit made up of a fifteenth resistor R15, a sixteenth resistor R16, an eleventh diode D11, a tenth capacitor C 10, a sixth tri-node switch element Qs6 and a seventh tri-node switch element Qs7 is a shielding and anti-interference circuit. After the voltage of the gate of the driving element $Q_L$ is kept high (i.e. the driving element $Q_L$ is turned on) for a while, the over-current detection circuit is activated. The circuit which is made up of a seventh resistor R17, the eighth resistor R18, and the twelfth diode D12 is used to sample a conducted current of the driving element $Q_L$, and the conducted current is compared with the reference voltage Vref to generate a protection signal Vpro. The principle of the protection circuit is to sample voltages of two nodes of the conducted element, such as a drain voltage and source voltage of a MOS, so as to reflect the current characteristic at the MOS. The voltage drop of the conducted element is compared with a reference value to produce a protection signal. When the driving output Vgs is of a low voltage, the gate voltage Vgs_Q6 is turned off. Therefore, the gate of the seventh tri-node switch element Q7 is of a high voltage so that the tri-node switch element Q7 is turned on and the comparator A outputs a high voltage. When the gate voltage Vgs is of a high voltage, the circuit made up of the fifth resistor R15 and the tenth capacitor delays the turning-on timing of the sixth tri-node switch element Q6. After the sixth tri-node switch is turned on, the gate voltage of the seventh tri-node switch element Q7 is pulled low so that the seventh tri-node switch element Q7 is turned off. The inverse voltage of the comparator A is:

$$V2 = Vds + \frac{Rs11}{Rs11 + Rs10}(Vcc2 - Vds),$$

and V2 is proportional to Vds. When the Vds is larger than a predetermined value, then V2>Vref, and the comparator A1 outputs a low voltage. Hence the charges of the gate of the driving element QL are released such that the driving element $Q_L$ is turned off.

The auxiliary power circuit 435 and the protection circuit 440 may be adapted to other foregoing embodiments of the invention.

Figure 19:
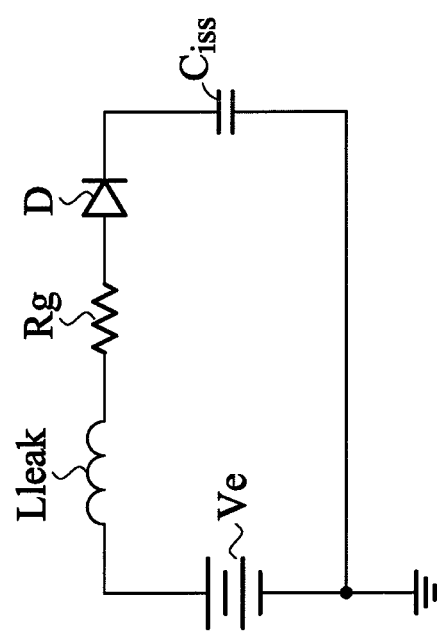
FIG. 19 is an equivalent circuit of the driver of one embodiment of the invention.

FIG. 19 is an equivalent circuit of the driver of the invention. The driver only provides energy when the equivalent gate capacitor Ciss is charged. So if the charge energy is reduced but charging speed and voltage amplitude of the equivalent gate capacitor Ciss can be still maintained, then driving consumption can be eliminated.

In the embodiment, the excitation inductance of the transformer T is large, such as 200 mH, so as to decrease excitation current of the transformer T. The turn ratio is 1:1, The resistor Rg is an equivalent total resistance of a charging loop, which includes output impedance of the first modulation circuit 420, internal resistance of the transformer T, the impedance of the unidirectional on device, agate equivalent series resistance of the driving element and loop wire resistance. The unidirectional on device Ds is equivalent to an ideal diode, impedance thereof and voltage source in series (i.e. Ds voltage drop). D is an ideal diode of Ds. Ve is equivalent charging excitation source. In the embodiment, Ve is a voltage drop between the power supply Vcc of the first modulation 420 and the equivalent total voltage of the charging loop is small, and consumption is smaller. $L_{leak}$ is equivalent to total inductance of the charging loop, which includes leakage inductance of transformer T, loop wire inductance and gate equivalent series inductance of the driving element $Q_L$.

Figure 20:
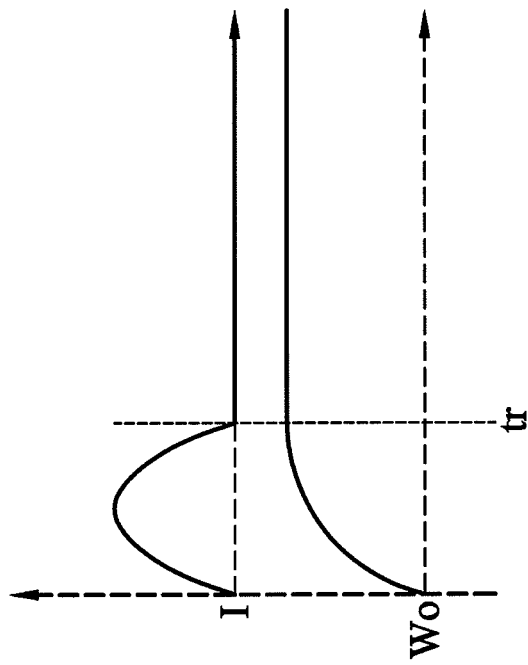
FIG. 20 is a waveform graph of FIG. 19.

FIG. 20 is a waveform graph of FIG. 19. The equivalent circuit of FIG. 19 is an LCR resonance circuit. However, the resonance circuit only completes a half of a resonance period due to the unidirectional on device Ds. I is resonance circuit current, Vo is the voltage of the equivalent gate capacitor Ciss.

Figure 21:
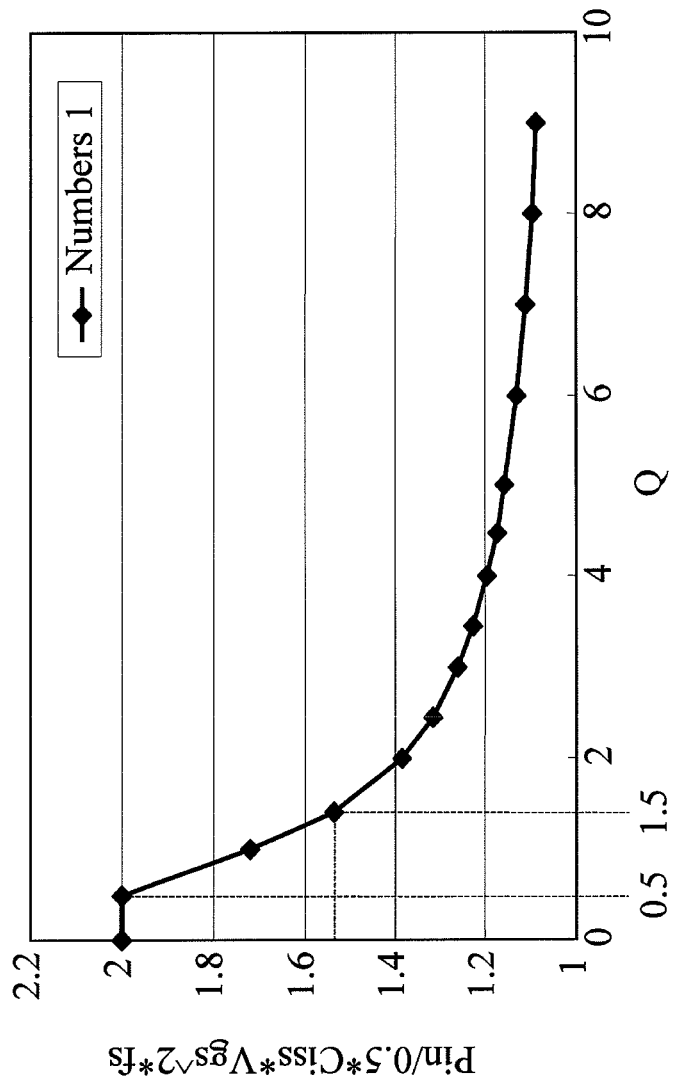
FIG. 21 is a curve showing a relationship between an input-output power ratio and quality factor of the driver of one embodiment of the invention.

FIG. 21 is a curve showing a relationship between an input-output power ratio and quality factor of the driver of the invention. The formula of resonance quality factor Q of the LCR resonance circuit can be expressed as following:

$$Q = \frac{\text{Stored Energy}}{\text{Disspated Energy}}$$

$$Q = \frac{1}{R_g} * \sqrt{\frac{L_{leak}}{C_{iss}}}$$

In the embodiment, the relationship of the input-output power ratio and quality factor of FIG. 21 can be obtained when the voltage drops of the diode and dynamic internal resistance thereof are ignored. The input power Pin of the LCR resonance circuit is the output power of Ve. 0.5 Ciss*Vgs^2*fs is the power the equivalent gate capacitor Ciss gets, i.e. the output power of the LCR resonance circuit. The ratio of input power Pin and the power the equivalent gate capacitor Ciss is small so that driving energy consumption is small.

According to FIG. 21, when Q is smaller than 0.5, input energy is 2 times the amount of the obtained energy. When Q is larger than 1.5, input energy is 1.5 times the amount of the obtained energy. When Q is larger than 6 and in approximate to 10, input energy is 1.1 times the amount of the obtained energy or less. At this moment, input energy is close to the obtained energy. When Q is large, then the requested loop total resistance Rg is small. To increase charging loop equivalent total inductance $L_{leak}$ to slow down rising edges of the driving signal, the loop total resistance Rg includes output impedance of the first modulation circuit 420, i.e. output impedance when the first modulation circuit 420 outputs the on-pulses. A small output impedance of the first modulation circuit 420 such as 5 ohm, or 2 ohm or less is needed in order to diminish driving energy consumption. When the first modulation circuit 420 outputs the off-pulses, because cut off signals are provided through coupling by the transformer, the output impedance of the first modulation circuit 420 during outputting the off-pulses does not affect driving energy consumption. Taking manufacturing and costs etc. into consideration, the output impedance during outputting of the off-pulses may be larger than that during outputting of the on-pulses, such as 5 ohm, 10 ohm, and 20 ohm and larger. If only the output impedance, during outputting the off-pulses, is not large enough to affect the turning-off of the switch element $Q_L$, the output impedance is much less than the input impedance of the second modulation circuit 430. The output impedance during outputting of the on-pulses may be less than 0.5 times that of that during outputting of the off-pulses. This can not only reduce costs but also increase the voltage level of the recovery pulses to protect magnetic saturation from occurring.

Figure 23A:
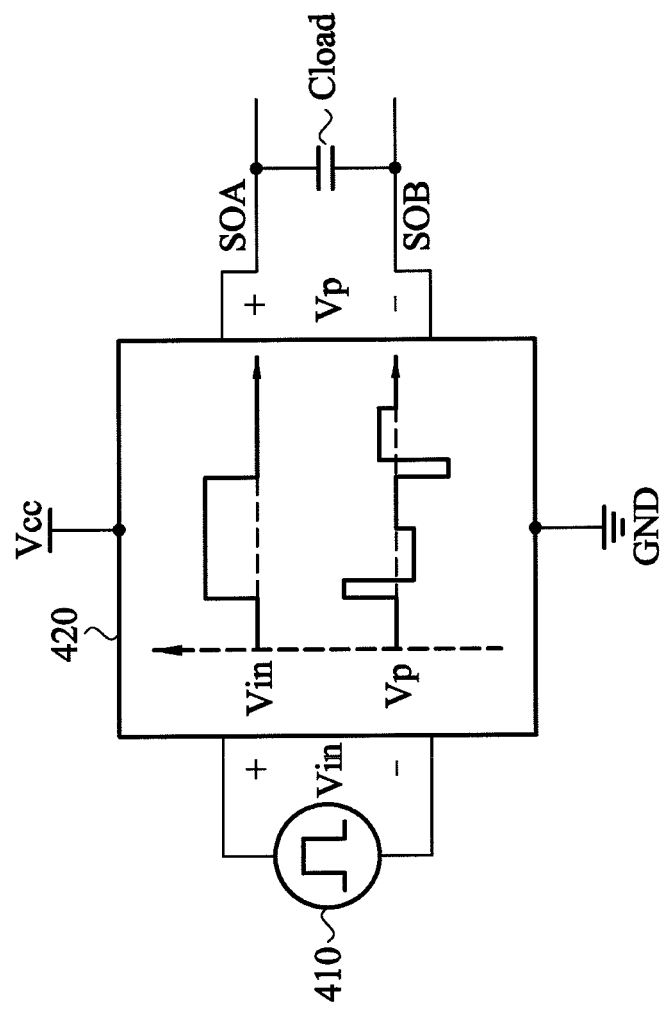
FIGS. 23a to 23c are curves illustrating the definition of output impedance of an on-pulse and off-pulse.
Figure 23C:
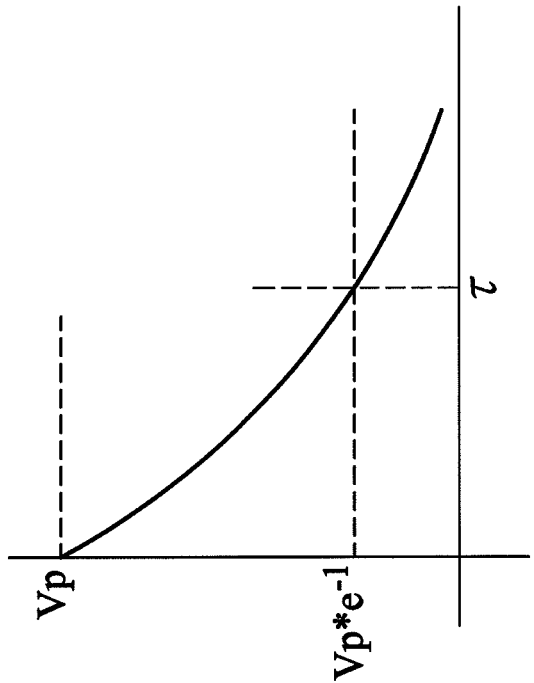
Figure 23B:
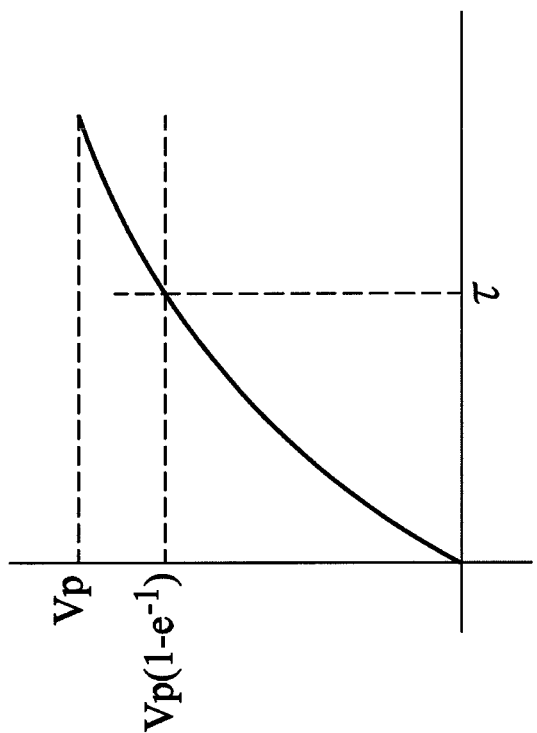

FIGS. 23a to 23c is curves illustrating the definition of output impedance of on-pulses and off-pulses. The on-pulses may be produced when SOA and SOB of FIG. 23a are respectively a high voltage and a low voltage. The off-pulses may be produced when SOA and SOB are respectively a low voltage and a high voltage. A load capacitor Cload (such as 100 pF) is connected between the SOA and SOB to test a rising time and falling time of the on-pulses and the off-pulses to get output impedance. FIG. 23a shows a test waveform for the on-pulses of the output impedance. After the on-pulses appear, the voltage amplitude of the load capacitor Cload rises from zero to the peak value Vp, the duration time that the voltage of the load capacitor Cload rises from zero to $V_p \cdot (1-e^{-1}) \approx 0.63 V_p$ is tr_load, wherein the time constant $t_{r\_load} = \tau = R_{ON\_rise} \cdot C_{load}$. Therefore, turn-on output impedance can be expressed as:

$$R_{ON\_rise} = \frac{t_{r\_load}}{C_{load}}.$$

Figure 1:
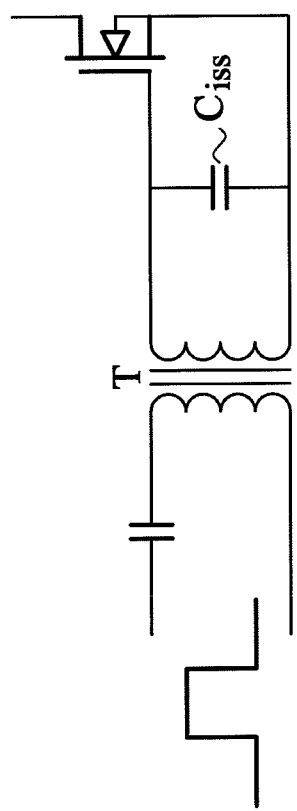
FIG. 1 is a diagram showing a conventional driver.
Figure 2:
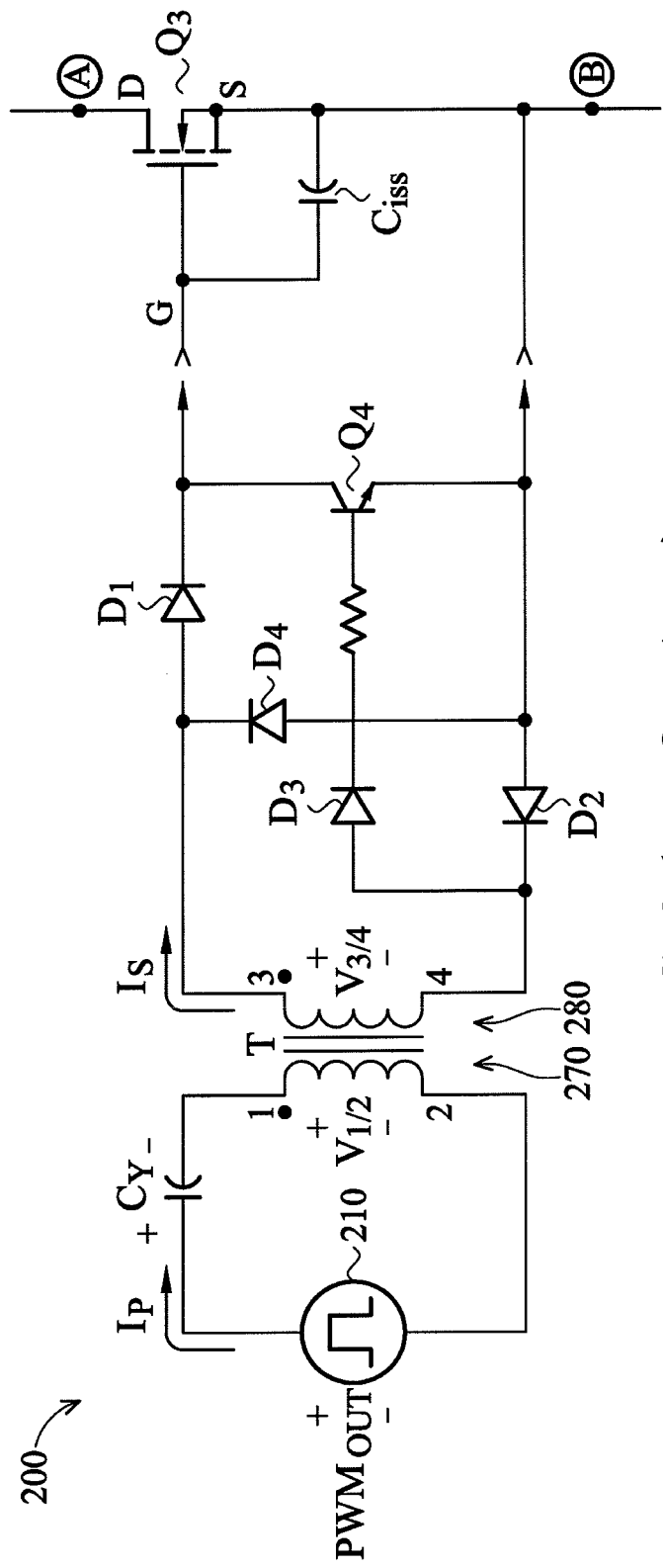
FIG. 2 is a schematic diagram showing a conventional driver.
Figure 3:
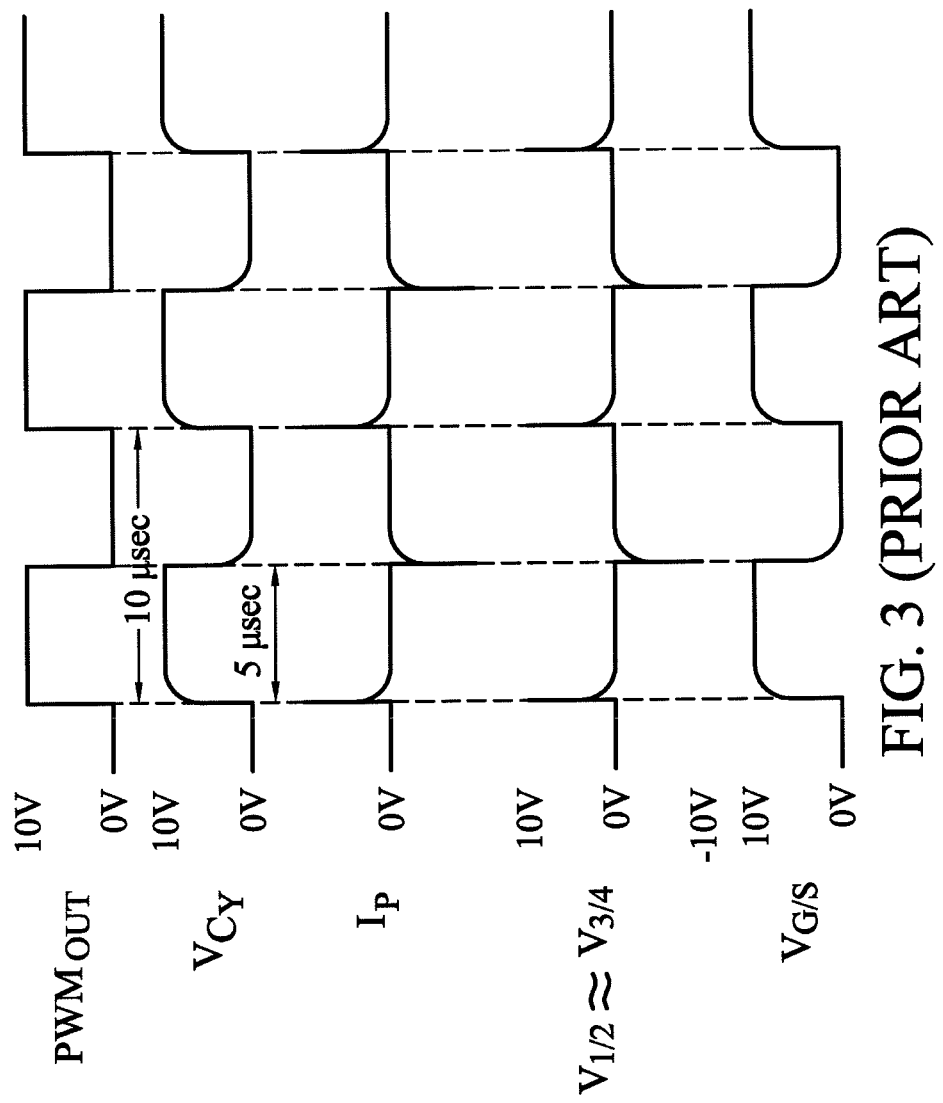
FIG. 3 is a waveform graph illustrating the driver of FIG. 2.

Similarly, FIG. 2b shows a test waveform for off-pulses of the output impedance. After the off-pulses appear, the amplitude of the load capacitor Cload is descended from a peak value Vp to zero. The duration time that the voltage of the load capacitor from peak value Vp to $V_p \cdot e^{-1} \approx 0.37 V_p$ is tf_load, and the time constant $t_{f\_load} = \tau = R_{OFF\_fall} \cdot C_{load}$. Therefore, turn-off impedance can be expressed as:

$$R_{OFF\_fall} = \frac{t_{f\_load}}{C_{load}}.$$

When the output impedance of the off-pulses is larger than that of the on-pulses, the width of the off-pulses is a little smaller than the width of the on-pulses such as 10 ns, 20 ns etc. In the initial status, residual off-pulses form negative products of amplitudes and widths cause negative excitation current in the transformer. The current causes voltage drop at the off-pulses impedance so that the products of amplitudes and widths of the off-pulses at the primary winding of the transformer T become smaller. Hence, the products of amplitudes and widths of the off-pulses are increasingly balanced with that of the on-pulses such that the transformer T is balanced without saturation. When the on-pulses and the off-pulses are processed as discussed above, the transformer T may maintain magnetic balance at high frequencies such as 2 MHz, 3 MHz, 5 MHz and higher. Consequently, the difference between the on-pulses and off-pulses are as small as possible.

Referring to FIG. 4, in the embodiment, LCR resonance occurs when the amplitude of the on-pulses is about Vp+ and the width of the on-pulses is about tp+. In order to reduce consumption caused by reverse recovery of the unidirectional on device Ds and possible interference, when the resonance current drops to the smallest value possible, the pulses must be removed after returning to zero. The resonance period can be expressed as:

$$T_r = \frac{4 \cdot \pi}{\left(\frac{4 \cdot L_{leak} - R_g^2 \cdot C_{iss}}{L_{leak}^2 \cdot C_{iss}}\right)^{0.5}}$$

When tp+ is larger than 5Tr/12, it can make sure that the consumption caused by reverse recovery of the unidirectional on device Ds and possible interference will not be too large when the resonance current is shrunk to half of the peak value. At this moment, the pulses can be removed. When tp+ is larger than 0.5Tr, the resonance current is almost zero. At this moment, the consumption of reverse recovery and interference will be smaller if the on-pulses are removed. In the embodiment, tp+ is a little larger than 0.5Tr 0.75Tr or 2Tr to be on the safe side. When tp+ is 2Tr, some signal oscillation caused by reverse recovery of the unidirectional on device Ds disappears. The relationship between an effective cross-sectional area Ae of the transformer T and width of on-pulses tp+ is expressed as:

$$A_e = \frac{V_{p+} \cdot t_{p+}}{N \cdot \Delta B}.$$

Figure 24:
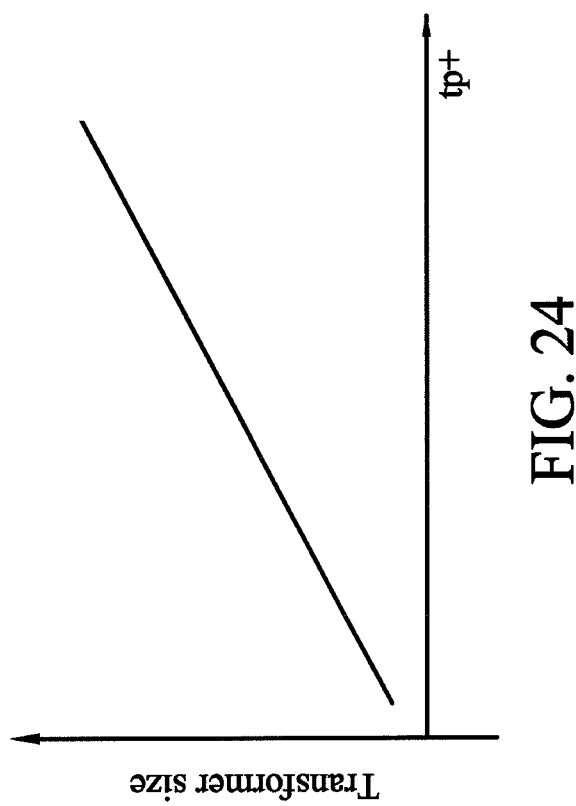
FIG. 24 is a curve showing a linear relationship between the size of transformers and on-pulse widths.

Vp+ is the output voltage of the first modulation circuit 420 (as associated described for FIG. 5), N is a winding turn of the transformer T, and ΔB is the allowable flux density of the transformer core. If the allowable flux density and the winding turn are not changed, the effective cross-sectional area is increased when tp+ is increased, i.e. the size of the transformer T is also increased. Therefore, tp+ should be smaller than 2Tr. Tr is designed for satisfying rising time tr of the equivalent gate capacitor Ciss voltage, where tr=05Tr. Hence, tp+ is associated with tr and the larger tr is, the larger tp+ is. In one embodiment, for example, tr is smaller than 1000 ns for large power IGBT, tr is smaller than 500 ns for a general MOSFET, and tr is smaller than 300 ns, 200 ns, 100 ns and less for a high speed driving to reduce switching consumption. According to the formula:

$$\Delta B = \frac{V_{p+} \cdot t_{p+}}{N \cdot A_e},$$

when the width of the on-pulses tp+ become narrow, the product of amplitude and width of the on-pulses become smaller. The effective cross sectional area Ae or winding turn N may be decreased correspondingly to lessen the size of the transformer T. Without changing the winding turn N, the amplitude of the on-pulses Vp+ and the excitation current peak value, the size of the transformer T is linearly increased with the width of the on-pulses as shown in FIG. 24.

That is, when the width of the on-pulses is decreased, the size of the transformer T is also decreased. For common conventional driving methods, if the frequency of the pulse signal is 100 kHz, the duty cycle is 50% (effective pulse width is about 5us), and the amplitude is 12V. In this case, an EE13 transformer size is needed to diminish driving consumption. For the method of one embodiment of the invention, if the width of the on-pulses is set as 1000 ns, then the size of the transformer may be shrunk to smaller than 10% of the transformer EE13, so that an EE8 transformer may be used in the invention. In one embodiment, the maximum width of on-pulses is about 1000 ns. That is, the width is approximately the width of the turn-on time tr of a big power IGBT. Thus, the method can be used to satisfy a majority of switch components.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A driver for driving a driving element, comprising:
a signal source, for providing a square signal;
a first modulation circuit, for providing on-pulses and off-pulses according to edges of the square signal;
a transformer, coupled to the first modulation circuit for coupling output signals of the first modulation circuit to a secondary winding of the transformer to form coupled signals;
a second modulation circuit, coupled to the second winding of the transformer for providing first operating pulses according to coupled on-pulses of the coupled signals, and providing second operating pulses according to coupled off-pulses of the coupled signals;
a unidirectional on device, coupled between a first node of the secondary winding of the transformer and a control node of the driving element; and
a switch device, having a control node coupled to the second modulation circuit, a first node coupled to the control node of the driving element and a second node coupled to a second node of the secondary winding of the transformer, wherein the switch device is turned off according to the first operating pulses and is turned on according to the second operating pulses,
wherein when the switch device is turned off, coupled on-pulses charge an equivalent capacitor of the driving element to a first driving potential to turn on the driving element, and when the switch device is turned off, the equivalent capacitor discharges to a second driving potential to turn off the driving element, and
wherein the width of the on-pulses is less than 1000 ns;
wherein the on-pulses and the off-pulses generate an excitation current at a primary winding of the transformer, and the first modulation circuit generates one or more recovery pluses to balance the excitation current according to the on-pulses and the off-pulses.

2. The driving circuit as claimed in claim 1, wherein the width of the on-pulses is less than 500 ns.

3. The driving circuit as claimed in claim 1, wherein the quality factor of the driving circuit is larger than 1.

4. The driving circuit as claimed in claim 1, wherein the first modulation circuit comprising:
a first pulse circuit, for producing first pulses according to rising edges of the square signal;
a second circuit, for producing second pulses according to falling edges of the square signal; and
a regulation circuit, for outputting the on-pulses and the off-pulses according to the first pulses and the second pulses.

5. The driving circuit as claimed in claim 4, wherein the regulation circuit further comprises:
a first transistor, having a control node coupled to the first pulse circuit, a first node coupled to a direct current source, and a second node coupled to a first node of the primary winding of the transformer;
a first diode, coupled between the second node of the first transistor and a ground;
a second diode, coupled between the control node and the second node of the first transistor; and
a second transistor, having a control node coupled to the signal source, a first node coupled to the second pulse circuit and a second node of the primary winding of the transformer, and a second node coupled to the ground.

6. The driving circuit as claimed in claim 4, wherein the first pulse circuit comprises:
a non-inverter, having an input node coupled to a first resistor and an output node outputting the first pulses;
a second resistor, coupled between the first resistor and the ground; and
a first capacitor, having a first node coupled to the signal source and a second node coupled to the first resistor and the second resistor,
wherein the first capacitor, the first resistor and the second resistor determine the width of the on-pulses,
wherein the second pulse circuit comprises:
an inverter, having an input node coupled to a third resistor and an output node outputting the second pulses;
a second capacitor, having a first node coupled to the signal source and a second node coupled to the third resistor;
a fourth resistor, having a first node coupled to a second node of the second capacitor and a second node coupled to the direct current source; and
a first regulator connected to a fifth resistor in series, disposed between the second node of second capacitor and the ground, and
wherein the second capacitor, the third resistor, the fourth resistor and the fifth resistor determine the width of the off-pulses.

7. The driving circuit as claimed in claim 6, wherein the first pulse circuit further comprises a first keep circuit, for keeping the driving element turned on when the pulse widths of the square signal with high potential are prolonged.

8. The driving circuit as claimed in claim 6, wherein the second pulse circuit further comprises a second keep circuit, for facilitating the gate of the driving element to be at a low potential and low impedance status when the pulse widths of the square signal with low potential are prolonged.

9. The driving circuit as claimed in claim 7, wherein the first keep circuit comprises:
a third transistor, having a control node coupled to the output node of the non-inverter, a first node coupled to the direct current source through a sixth resistor, and a second node coupled to the ground;
a third capacitor, coupled between the first node and the second node of the third transistor; and
a third diode, coupled between the second node of the first capacitor and the first node of the third transistor.

10. The driving circuit as claimed in claim 8, wherein the second keep circuit comprises:
a fourth diode, having a first node coupled to the signal source through a fifth diode, and a second node coupled to the output node of the inverter;
a seventh resistor, having a first node coupled to the fourth resistor, and a second node coupled to a first node of the fourth diode; and
a fourth capacitor, having a first node coupled to the fourth resistor and the seventh resistor, and a second node coupled to the ground.

11. The driving circuit as claimed in claim 4, wherein the first pulse circuit comprises:
a XOR gate, having a first input node coupled the signal source;
an eighth resistor coupled between the first and the second input nodes of the XOR gate;
a fifth capacitor, coupled between the second input node of the XOR gate and the ground; and
a first AND gate, having a first input node coupled to the output node of the XOR gate, a second input node coupled to the signal source, and a output node outputting the first pulses,
wherein the eighth resistor and the fifth capacitor determine the width of the on-pulses and the width of the off-pulses, and
wherein the second pulse circuit comprises:
a second AND gate, having a first input node coupled the output node of the XOR gate, the second input node coupled the second input node of the XOR gate and a output node outputting the second pulses.

12. The driving circuit as claimed in claim 4, wherein the width of the on-pulses is larger than or equal to a 5/12 resonance period (Tr).

13. The driving circuit as claimed in claim 1, wherein the second modulation circuit comprises:
a switch circuit, having a first node coupled to the first node of the secondary winding of the transformer, and a second node coupled to the control node of the switch device; and
a control circuit, having a first node coupled to a first node of the switch circuit, and a second node coupled to the control node of the switch circuit, for controlling the switch circuit,
wherein when the amplitude of the on-pulses is larger than a predetermined threshold, the first node and the second node of the switch circuit are switched off such that the second node of the switch circuit maintains a high potential, and
wherein when the switch circuit receives the off-pulses, the first node and the second node of the switch circuit are switched on.

14. The driving circuit as claimed in claim 1, wherein the second modulation circuit comprises:
a first tri-node switch element, having a control node coupled to the second node of the secondary winding of the transformer through a series resistor and a second regulator, a first node coupled to the first node of the secondary winding of the transformer, and a second node coupled to the control node of the switch device; and
a sixth capacitor, coupled between the first node and the control node of the first tri-node switch element.

15. The driving circuit as claimed in claim 14, further comprising a ninth resistor connected to a sixth diode in series, disposed between the control node of the first tri-node switch element and the second node of the secondary winding of the transformer.

16. The driving circuit as claimed in claim 1, wherein the second modulation circuit comprises:
a second tri-node switch element, having a control node coupled to the second node of the second winding of the transformer through a third regulator, a first node coupled to the first node of the secondary winding of the transformer and a second node coupled to the control node of the switch device;
a tenth resistor, connected to the third regulator in parallel; and
an eleventh resistor, connected to a seventh capacitor in parallel, coupled to the control node and first node of the second tri-node switch element.

17. The driving circuit as claimed in claim 1, wherein the second modulation comprises:
a third tri-node switch element, having a first node coupled to the first node of the secondary winding of the transformer, and the second node coupled to the control node of the switch device;
a fourth tri-node switch element, having a first node coupled to the control node of the third tri-node switch element, a control node coupled to the first node of the secondary winding of the transformer, and a second node coupled to the second node of the secondary winding of the transformer;
an eighth diode coupled between the first node and the second node of the fourth tri-node switch element; and
an eighth capacitor, coupled between the first node and the control node of the third tri-node switch element.

18. The driving circuit as claimed in claim 1, wherein the second modulation circuit comprises:
a fifth tri-node switch element, having a first node coupled to the control node of the switch device, a second node coupled to the first node of the secondary winding of the transformer through a ninth diode, and a control node coupled to the second node of the secondary winding of the transformer.

19. The driving circuit as claimed in claim 1, wherein the second modulation circuit comprises a push-pull circuit, disposed between the first node of the secondary winding of the transformer and the unidirectional on device.

20. The driving circuit as claimed in claim 1, wherein the impedance of the on-pulses is smaller than that of the off-pulses.

21. The driving circuit as claimed in claim 1, wherein the impedance of the on-pulses is 0.5 times smaller than that of the off-pulses.

22. The driving circuit as claimed in claim 1, wherein the width of the on-pulses is smaller than the width of the off-pulses.

23. The driving circuit as claimed in claim 1, further comprising a protection circuit coupled between the first node of the secondary winding of the transformer and the second modulation circuit, wherein the protection circuit comprises:
- a comparator, having a first input node coupled to a thirteenth resistor and a fourteenth resistor, a second input node coupled to a seventeenth resistor and a eighteenth resistor, and a output node coupled to the control node of the switch device;
- a fourth regulator, coupled to a ninth capacitor in parallel, having a first node coupled to the thirteenth resistor, and a second node coupled to the ground and the fourteenth resistor;
- a twelfth diode, coupled to a twelfth resistor, having a node coupled to a first node of the fourth regulator, the sixteenth resistor and the seventeenth resistor;
- a fifteenth resistor, coupled to a eleventh diode in parallel, having a node coupled to the twelfth diode and the unidirectional on device;
- a sixth tri-node switch element, having a first node coupled to the sixteenth resistor, a second node coupled to the ground and a control node coupled to the fifteenth resistor;
- a tenth capacitor, coupled between the control node of the six tri-node switch element and ground; and
- a seventh tri-node switch element, having a control node coupled to a first node of the sixth tri-node switch element, a first node coupled to the eighteenth resistor and the second node coupled to the ground.

24. A driving circuit for driving a driving element, comprising:
- a signal source, for providing a square signal;
- a first modulation circuit, for providing on-pulses and off-pulses according to edges of the square signal;
- a transformer, coupling to the first modulation circuit for coupling output signals of the first modulation circuit to a secondary winding of the transformer to form coupled signals;
- a second modulation circuit, coupled to the second winding of the transformer for providing first operating pulses according to coupled on-pulses of the coupled signals, and providing second operating pulses according to coupled off-pulses of the coupled signals;
- a unidirectional on device, coupled between a first node of the secondary winding of the transformer and a control node of the driving element; and
- a unidirectional switch device, having a first node coupled to the control node of the driving element and a second node coupled to a second node of the secondary winding of the transformer, for turning off the unidirectional switch device according to the first operating pulses, and turning off the unidirectional switch device according to the second operating pulses,
- wherein when the unidirectional switch device is turned off, coupled on-pulses charge an equivalent capacitor of the driving element to a first driving potential to turn on the driving element, and when the unidirectional switch device is turned off, the equivalent capacitor discharges to a second driving potential to turn off the driving element;
- wherein the on-pulses and the off-pulses generate an excitation current at a primary winding of the transformer, and the first modulation circuit generates one or more recovery pluses to balance the excitation current according to the on-pulses and the off-pulses.

25. The driving circuit as claimed in claim 24, wherein the unidirectional switch device comprises:
- a switch element, having a control node coupled to the second modulation circuit, a first node coupled to the control node of the driving element;
- a diode element coupled between the second node of the switch element and the second node of the transformer; and
- a nineteenth resistor coupled to the first node and the control node of the switch element.

26. The driving circuit as claimed in claim 24, further comprising a bidirectional switch element, having a first node coupled to the second node of the secondary winding of the transformer, a second node coupled to the second node of the unidirectional switch device, and a control node coupled to the first node of the secondary winding of the transformer.

27. The driving circuit as claimed in claim 24, wherein the quality factor Q of the driving circuit is larger than 1.

28. The driving circuit as claimed in claim 24, wherein the width of the on-pulses is larger than a 5/12 resonance period (Tr).

29. The driving circuit as claimed in claim 24, wherein the output impedance of the on-pulses is smaller than that of the off-pulses.

30. The driving circuit as claimed in claim 29, wherein the output impedance of the on-pulses is 0.5 times smaller than the output impedance of the off-pulses.

31. The driving circuit as claimed in claim 24, wherein the width of the on-pulses is smaller than the width of the off-pulses.

32. The driving circuit as claimed in claim 1, wherein the potentials of the on-pulses and the recovery pulses are opposite.

33. The driving circuit as claimed in claim 24, wherein the potentials of the on-pulses and the recovery pulses are opposite.

34. The driving circuit as claimed in claim 1, wherein the potentials of the off-pulses and the recovery pulses are opposite.

35. The driving circuit as claimed in claim 24, wherein the potentials of the off-pulses and the recovery pulses are opposite.

* * * * *